(12) United States Patent
Yoshihara et al.

(10) Patent No.: US 11,876,080 B2
(45) Date of Patent: Jan. 16, 2024

(54) SEMICONDUCTOR MEMORY DEVICE

(71) Applicant: KIOXIA CORPORATION, Tokyo (JP)

(72) Inventors: Masahiro Yoshihara, Yokohama Kanagawa (JP); Toshikazu Watanabe, Chigasaki Kanagawa (JP); Nobuharu Miyata, Yokohama Kanagawa (JP); Yasumitsu Nozawa, Yokohama Kanagawa (JP); Tomohito Kawano, Yokohama Kanagawa (JP); Sachie Fukuda, Ota Tokyo (JP); Akiyoshi Itou, Shinagawa Tokyo (JP); Toshimitsu Iwasawa, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/860,830

(22) Filed: Jul. 8, 2022

(65) Prior Publication Data

US 2022/0344307 A1    Oct. 27, 2022

Related U.S. Application Data

(63) Continuation of application No. 17/011,487, filed on Sep. 3, 2020, now Pat. No. 11,410,974.

(30) Foreign Application Priority Data

Dec. 3, 2019    (JP) ................... 2019-218676

(51) Int. Cl.
*H01L 25/065*    (2023.01)
*H01L 23/00*    (2006.01)
(Continued)

(52) U.S. Cl.
CPC .......... *H01L 25/0657* (2013.01); *H01L 24/06* (2013.01); *H01L 24/09* (2013.01);
(Continued)

(58) Field of Classification Search
CPC ....... H01L 25/0657; H01L 2225/06506; H01L 2225/0651; H01L 2225/06562;
(Continued)

(56) References Cited

U.S. PATENT DOCUMENTS 7,683,491 B2    3/2010    Itoh et al.
7,732,930 B2    6/2010    Makino et al.
(Continued)

FOREIGN PATENT DOCUMENTS

JP    H09-260578 A    10/1997

*Primary Examiner* — Jasmine J Clark
(74) *Attorney, Agent, or Firm* — Kim & Stewart LLP

(57) ABSTRACT

A semiconductor memory device includes first and second memory chips, each including a region of a core circuit, a first area adjacent to a first side of the region in a first direction, a second area adjacent to a second side of the region in a second direction, a third area adjacent to the first area in the first direction and to the second area in the second direction, a first pad in the first area, a second pad in the second area, and third pad in the third area. In each memory chip, a first bonding wire connects the first and third pads. In addition, a second bonding wire connects the second pads of the first and second memory chips. The second memory chip is stacked on the first memory chip to expose the first, second, and third areas of the first memory chip in a third direction.

20 Claims, 25 Drawing Sheets

(51) Int. Cl.
*G11C 16/30* (2006.01)
*G11C 16/04* (2006.01)
*G11C 16/26* (2006.01)
*G11C 16/08* (2006.01)

(52) U.S. Cl.
CPC .............. *H01L 24/48* (2013.01); *H01L 24/49* (2013.01); *G11C 16/0483* (2013.01); *G11C 16/08* (2013.01); *G11C 16/26* (2013.01); *G11C 16/30* (2013.01); *H01L 2224/06165* (2013.01); *H01L 2224/09165* (2013.01); *H01L 2224/4813* (2013.01); *H01L 2224/48105* (2013.01); *H01L 2224/4911* (2013.01); *H01L 2225/0651* (2013.01); *H01L 2225/06506* (2013.01); *H01L 2225/06562* (2013.01); *H01L 2225/06575* (2013.01); *H01L 2924/14511* (2013.01); *H01L 2924/182* (2013.01)

(58) Field of Classification Search
CPC ..... H01L 2225/06575; H01L 23/49575; H01L 23/4952; H01L 23/3107; H01L 24/06; H01L 24/09; H01L 24/48; H01L 24/49; H01L 24/45; H01L 2224/09165; H01L 2224/48105; H01L 2224/4811; H01L 2224/4911; H01L 2224/05554; H01L 2224/06135; H01L 2224/06515; H01L 2224/45144; H01L 2224/48091; H01L 2224/48147; H01L 2224/48247; H01L 2924/1434; H01L 2924/00014; H01L 2924/48091; H01L 25/065; H01L 25/0652; H01L 25/0655; H01L 25/16; H01L 25/162; H01L 25/165; H01L 25/167; H01L 25/18; G11C 5/025; G11C 5/06; H10B 80/00
USPC ................................ 257/685, 686, 773, 777
See application file for complete search history.

(56) References Cited

U.S. PATENT DOCUMENTS

| | | | |
|---|---|---|---|
| 8,274,142 B2 | 9/2012 | Denda | |
| 11,737,215 B2 * | 8/2023 | Lee | ...................... H10K 59/131 257/773 |
| 2010/0109141 A1 | 5/2010 | Nishiyama et al. | |
| 2011/0068449 A1 | 3/2011 | Kook | |
| 2012/0025396 A1 | 2/2012 | Liao et al. | |
| 2017/0170156 A1 * | 6/2017 | Hong | ...................... H01L 25/18 |
| 2018/0342481 A1 | 11/2018 | Lee et al. | |

* cited by examiner

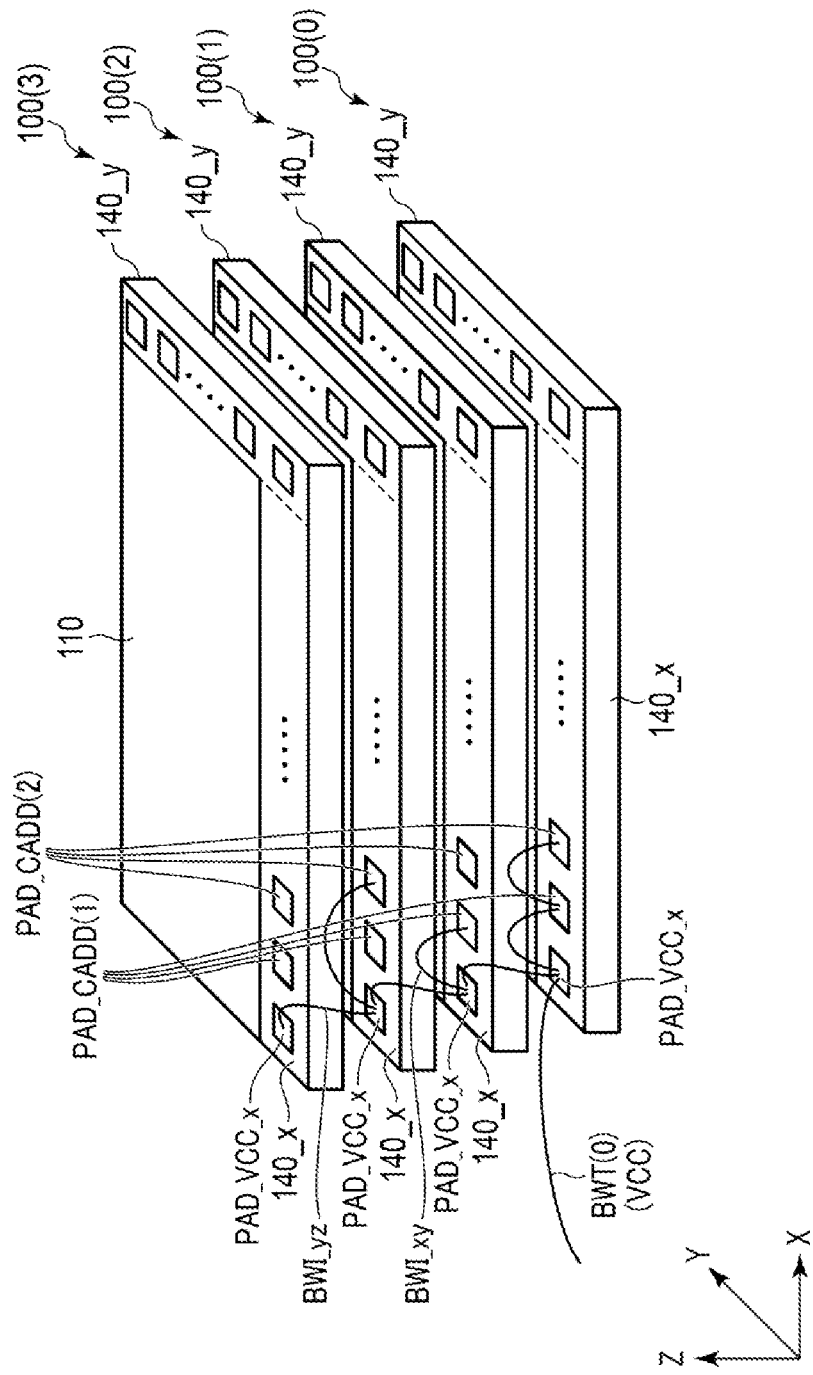

SEMICONDUCTOR MEMORY DEVICE

CROSS-REFERENCE TO RELATED APPLICATION(S)

This application is a continuation of U.S. patent application Ser. No. 17/011,487, filed Sep. 3, 2020, now U.S. Pat. No. 11,410,974, issued Aug. 9, 2022, which is based upon and claims the benefit of priority from Japanese Patent Application No. 2019-218676, filed Dec. 3, 2019, the entire contents of which are incorporated herein by reference.

FIELD

Embodiments relate to a semiconductor memory device.

BACKGROUND

A NAND flash memory is known as one type of semiconductor memory device.

BRIEF DESCRIPTION OF THE DRAWINGS

FIG. 29 is a perspective view of a stack structure in which memory chips are stacked according to a fifth embodiment.

DETAILED DESCRIPTION

Figure 1:
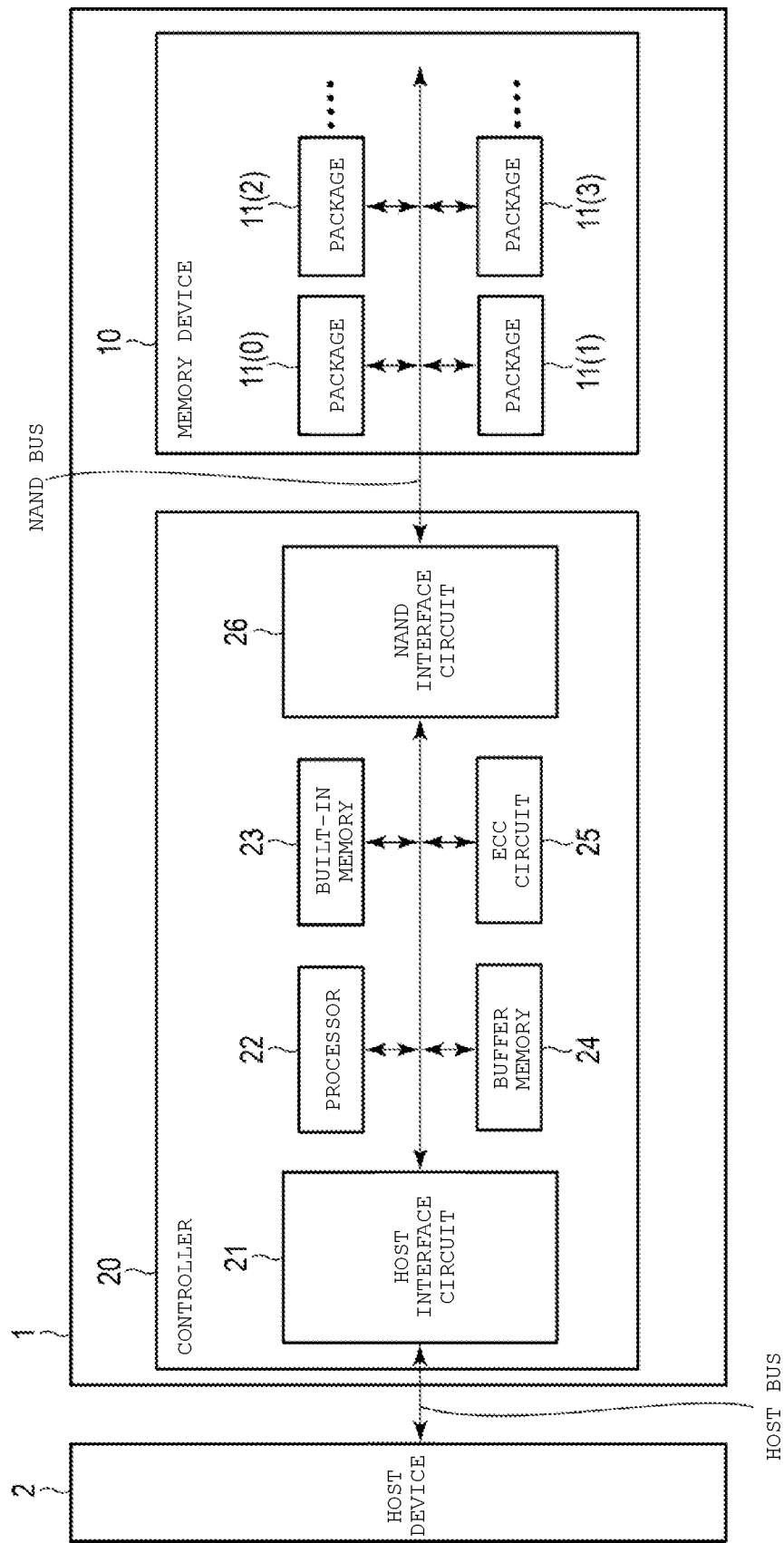
FIG. 1 is a block diagram illustrating an example of a configuration of a memory system according to embodiments.

Embodiments provide a high quality semiconductor memory device.

In general, according to one embodiment, a semiconductor memory device includes a first memory chip, a second memory chip, and first, second, and third bonding wires. The first memory chip includes a first core circuit in which a plurality of memory cells are provided, the first core circuit being arranged in a first rectangular region with a first side extending in a first direction and a second side extending in a second direction orthogonal to the first direction, a first area adjacent to the first side and extending in the first direction, a second area adjacent to the second side and extending in the second direction, a third area adjacent to the first area in the first direction and adjacent to the second area in the second direction, a first pad provided in the first area, a second pad provided in the second area, and a third pad provided in the third area. The second memory chip includes a second core circuit in which a plurality of memory cells are provided, the second core circuit being arranged in a second rectangular region with a third side extending in the first direction and a fourth side extending in the second direction, a fourth area adjacent to the third side and extending in the first direction, a fifth area adjacent to the fourth side and extending in the second direction, a fourth pad provided in the fourth area, a fifth pad provided in the fifth area, and a sixth pad provided in the sixth area. The first bonding wire connects the first pad and the third pad. The second bonding wire connects the fourth pad and the sixth pad. The third bonding wire connects the second pad and the fifth pad. The second memory chip is stacked on the first memory chip to define a space in which the first, second, and third areas of the first memory chip are exposed in a third direction orthogonal to the first and second directions to be in contact with an encapsulating resin.

Hereinafter, embodiments will be described with reference to the drawings. Each embodiment provides an example of a device or method for embodying the technical idea of the disclosure. The drawings are schematic or conceptual, and the dimensions and proportions of the drawings are not necessarily the same as the actual ones. The technical idea of the present disclosure is not limited by the particular shape, structure, arrangement, or the like of the elements.

In the following descriptions, the same reference signs will be given to the same elements having substantially the same functions and configurations. The numbers after the reference signs are used to distinguish between elements that have similar configurations. If it is not necessary to distinguish the elements denoted by the same reference signs, the elements are referenced using only the reference signs.

1. First Embodiment

1-1. Configuration

A configuration of a memory system according to a first embodiment will be described.

1-1-1. Overall Configuration of Memory System

A configuration example of the memory system according to the first embodiment will be described with reference to FIG. 1. FIG. 1 is a block diagram illustrating an example of a configuration of a memory system according to embodiments. A memory system 1 is connected to a host device 2 via a host bus, and functions as an external storage device of the host device 2 (also referred to as a host device or an external device). The host device 2 may be, for example, an information processing device such as a personal computer, a mobile phone, or an imaging device, may be a mobile terminal such as a tablet computer or a smartphone, may be a game device, or may be a vehicle-mounted terminal such as a car navigation system. The memory system 1 stores the data from the host device 2 and also reads the data out to the host device 2.

As illustrated in FIG. 1, the memory system 1 includes a controller 20 and a memory device (also referred to as a memory unit or a memory device) 10. The controller 20 receives a command from the host device 2 and controls the memory device 10 based on the received command. Specifically, the controller 20 writes the data instructed by the host device 2 to be written, into the memory device 10, and reads the data instructed by the host device 2 to be read, from the memory device 10, and then, transmits the data to the host device 2. The controller 20 is connected to the memory device 10 via a NAND bus. The memory device 10 includes a plurality of memory cells and stores the data in a nonvolatile manner. The memory device 10 is a device that stores the data in a nonvolatile manner. The memory device 10 is, for example, a nonvolatile semiconductor memory that includes a plurality of packages 11 (also referred to as a semiconductor memory device) (in FIG. 1, four packages 11(0), 11(1), 11(2), and 11(3) are illustrated).

The memory system 1 may be a memory card in which the controller 20 and the memory device 10 are configured as one package, or may be a solid state drive (SSD).

1-1-2. Configuration of Controller

Subsequently, the controller in the memory system according to the embodiments will be described with reference to FIG. 1. The controller 20 includes a host interface circuit 21, a processor (e.g., central processing unit (CPU)) 22, a built-in memory (e.g., random access memory (RAM)) 23, a buffer memory 24, an error check and correction (ECC) circuit 25, and a NAND interface circuit 26.

The host interface circuit 21 is connected to the host device 2 and manages the communication with the host device 2. The host interface circuit 21 may be an UFS interface conforming to the universal flash storage (UFS) standard, a SAS interface conforming to the serial attached SCSI (SAS) standard, an interface conforming to other standards, or simply a communication cable. The host interface circuit 21 transfers, for example, the command and data received from the host device 2 to the processor 22 and the buffer memory 24, respectively.

The processor 22 controls the overall operations of the controller 20. For example, the processor 22 issues a read command that is based on the NAND interface circuit 26 to the memory device 10 in response to the data read command received from the host device 2. This operation is the same for writing and erasing. In addition, the processor 22 has a function of performing various arithmetic operations on the read data from the memory device 10. When the memory system 1 is supplied with power from a power source, the processor 22 controls the overall operations of the controller 20 by reading firmware (control program) stored in the ROM (not illustrated) into the buffer memory 24 or the built-in memory 23 in the controller 20 and performing predetermined processing. Here, the processor 22 is also referred to as a core or a processor core. The overall control of the operations of the controller 20 may be implemented not by the firmware executed by the processor 22 but by dedicated hardware.

The built-in memory 23 is, for example, a semiconductor memory such as dynamic RAM (DRAM) and is used as a work area of the processor 22. The built-in memory 23 stores firmware for managing the memory device 10, various management tables, and the like.

The buffer memory 24 temporarily stores the data and the like received by the controller 20 from the memory device 10 and the host device 2. Specifically, the buffer memory 24 is configured with a general-purpose memory such as static RAM (SRAM) or DRAM. The buffer memory 24 may be mounted inside the controller 20 or may be mounted outside the controller 20 independent of the controller 20.

The ECC circuit 25 performs error detection and error correction processing. Specifically, when writing the data, an ECC code is generated for each set of a certain number of data based on the data received from the host device 2. In addition, when reading the data, decoding is performed based on the ECC code to detect the presence or absence of an error. Then, when the error is detected, a position of the bit is specified and the error is corrected.

The NAND interface circuit 26 is connected to the memory device 10 via the NAND bus and manages the communication with the memory device 10. The NAND interface circuit 26 transmits a command CMD, an address ADD, and the write data to the memory device 10 by the instruction from the processor 22. The NAND interface circuit 26 also receives the read data from the memory device 10.

1-2-3. Configuration of Package

Figure 2:
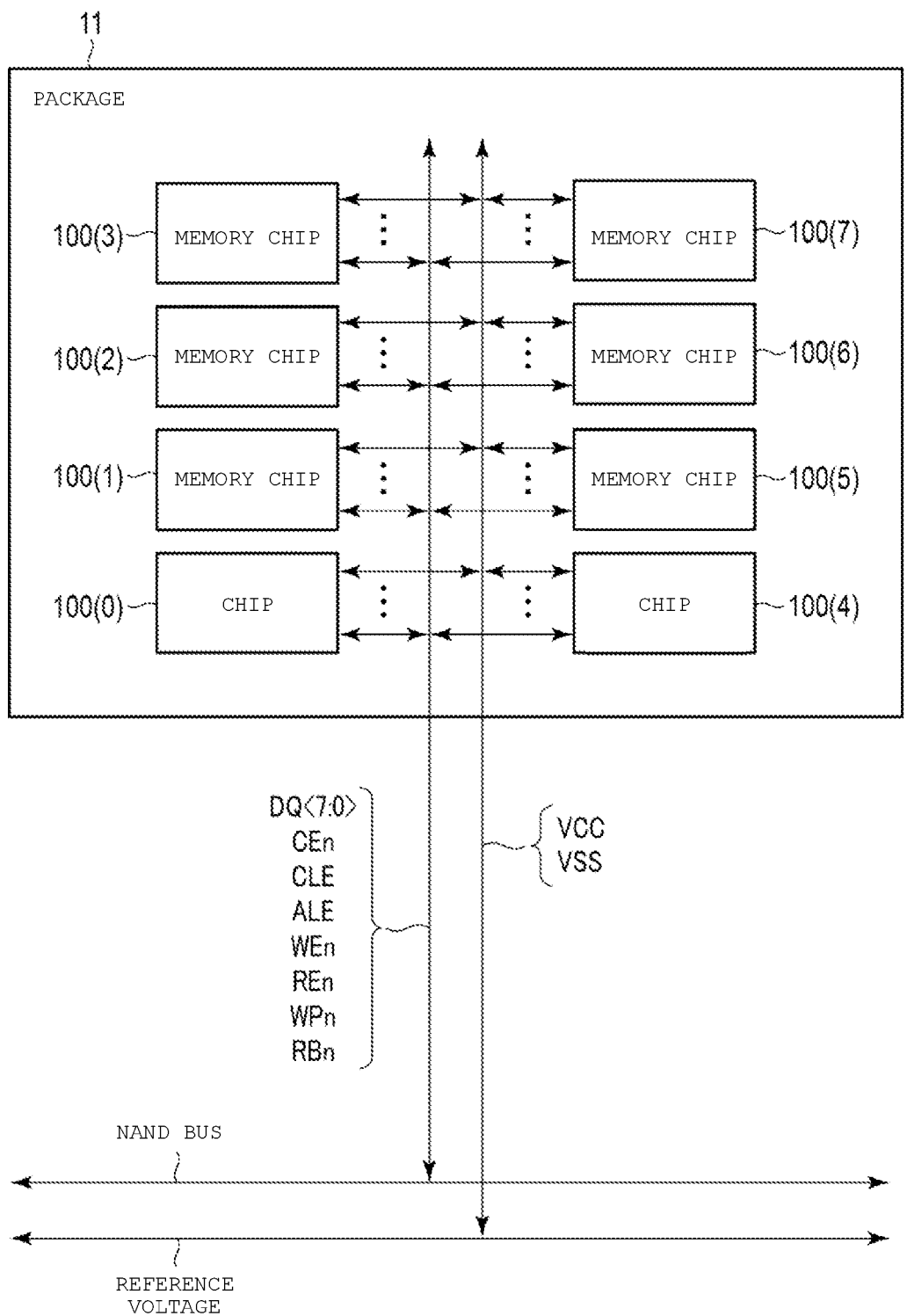
FIG. 2 is a block diagram illustrating an example of a configuration of a package according to the embodiments.

Next, a configuration example of the package according to the embodiments will be described with reference to FIG. 2. FIG. 2 is a block diagram illustrating an example of a configuration of the package according to the embodiments.

As illustrated in FIG. 2, each of the packages 11 includes a plurality of memory chips (also referred to as chips) 100 (in FIG. 2, eight memory chips 100 (100(0) to 100(7)) are illustrated). Each of the memory chips 100 can operate independently of each other, and one example thereof is a NAND flash memory chip. In the NAND flash memory chip, writing and reading are generally performed in data units called pages, and erasing is performed in data units called blocks.

Each of the memory chips 100 is connected to the NAND bus.

The NAND bus transmits and receives signals CEn, CLE, ALE, WEn, REn, WPn, RBn, and DQ<7:0> according to the NAND interface standard via individual signal lines. The signal CEn is a signal for enabling the memory chips 100. The signal CLE notifies the memory chip 100 that the signal DQ<7:0> supplied to the memory chip 100 while the signal CLE is at an "H (High)" level is a command. The signal ALE notifies the memory chip 100 that the signal DQ<7:0> supplied to the memory chip 100 while the signal ALE is at the "H" level is an address. The signal WEn instructs the memory chip 100 to capture the signal DQ<7:0> supplied to the memory chip 100 while the signal WEn is at an "L (Low)" level. The signal REn instructs the memory chip 100 to output the signals DQ<7:0>. The signal WPn instructs the memory chip 100 to prohibit data writing and data erasing therein. The signal RBn indicates whether the memory chip 100 is in a ready state (a state in which an external command can be received) or in a busy state (a state in which an external command cannot be received). The signal DQ<7:0> is an 8-bit signal, for example. The signal DQ<7:0> is the data transmitted and received between the memory chip 100 and the controller 20, and includes a command CMD, an address ADD, and data DAT. The data DAT includes write data and read data.

In addition, the memory chip 100 is supplied with, for example, the voltages VCC and VSS as external reference voltages from the outside. The voltage VCC is, for example, a power supply voltage for driving the memory chip 100, and the voltage VSS is, for example, a ground voltage, which is lower than the voltage VCC.

1-2-4 Configuration of Memory Chip

Figure 3:
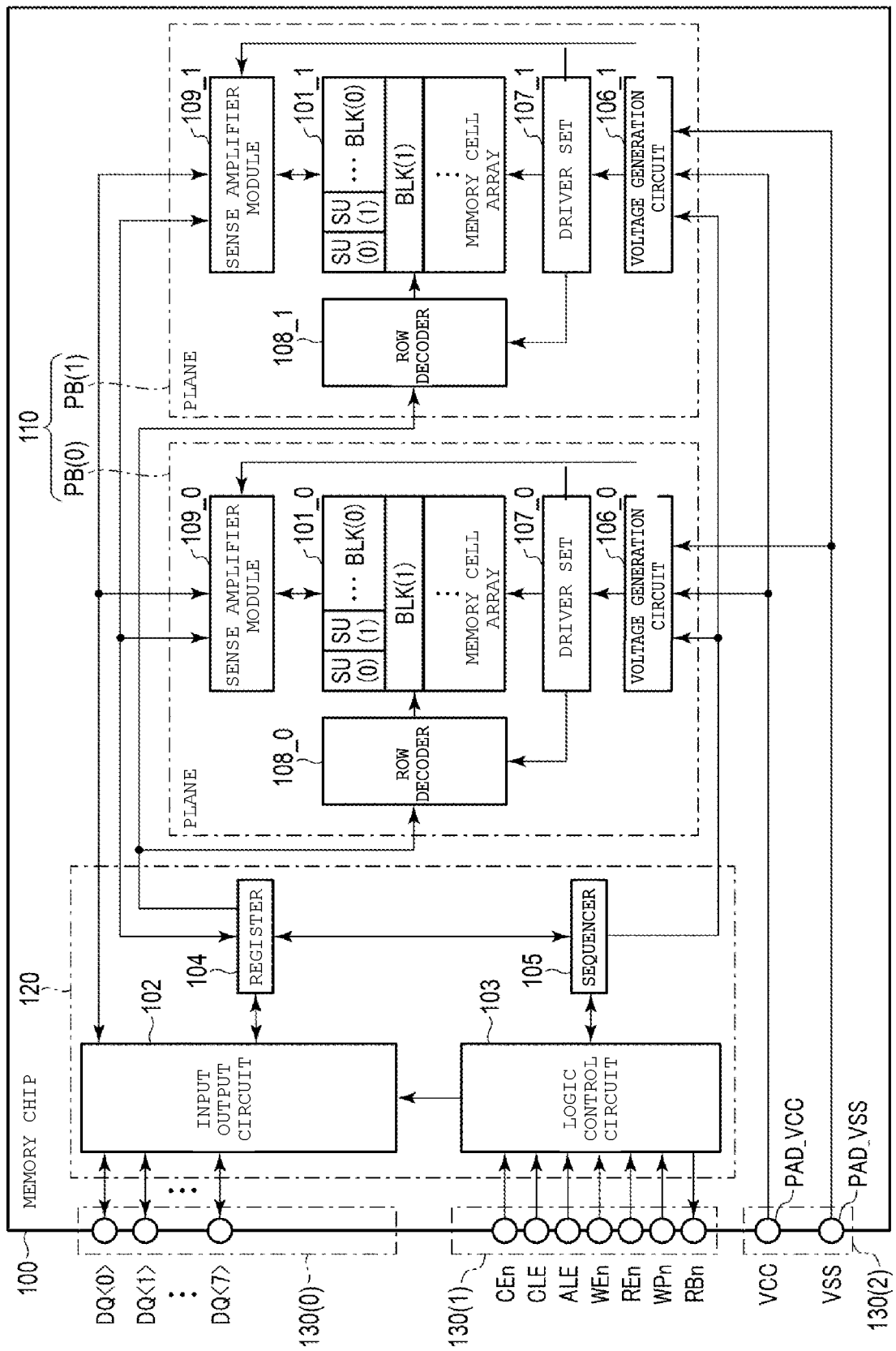
FIG. 3 is a block diagram illustrating an example of a configuration of a memory chip according to a first embodiment.
Figure 4:
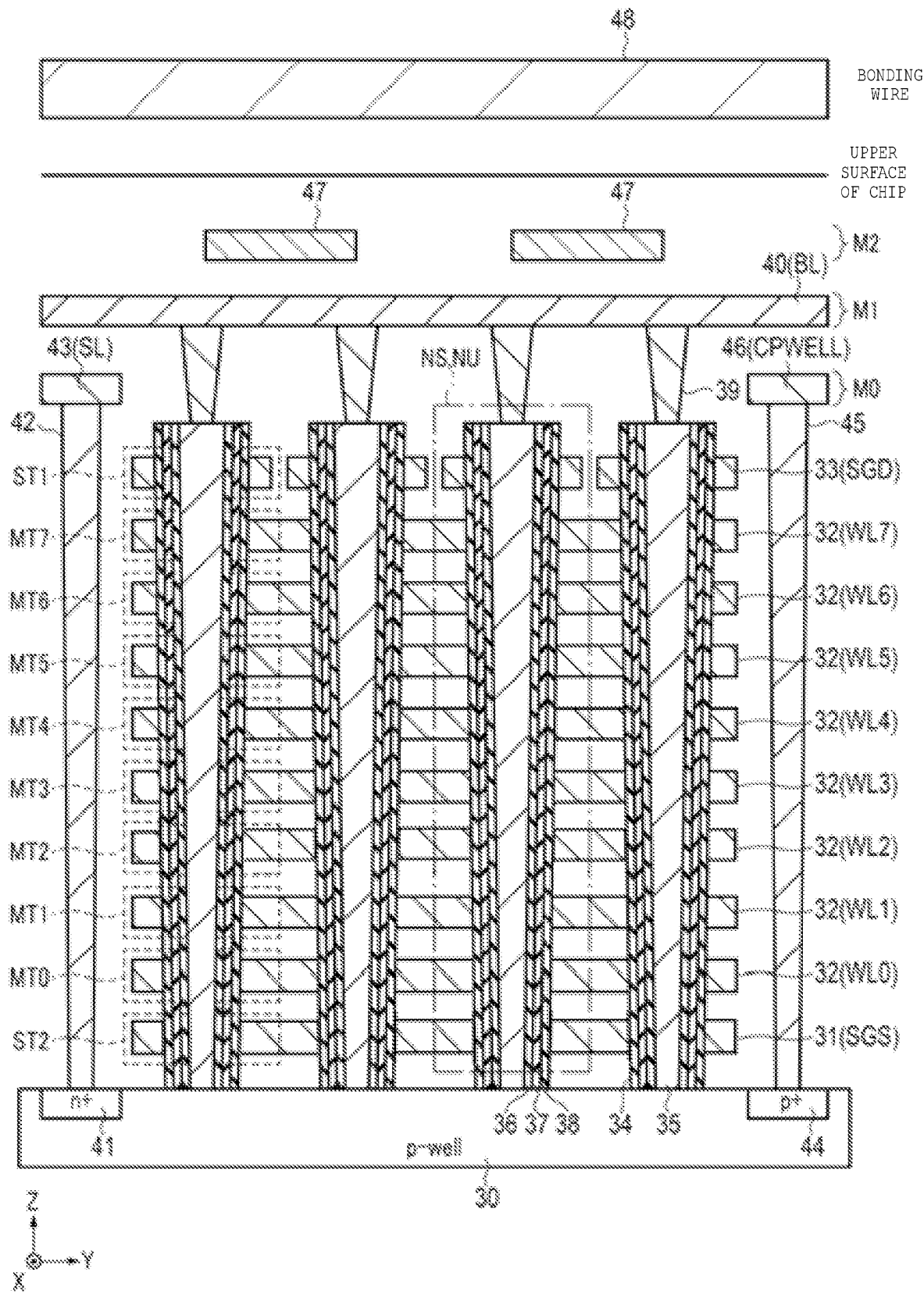
FIG. 4 is a cross-sectional view illustrating a part of an area of a block of memory cells.

Next, a configuration example of the memory chip according to a first embodiment will be described. FIG. 3 is a block diagram illustrating an example of the configuration of the memory chip according to the first embodiment. FIG. 4 is a cross-sectional view illustrating a part of an area of a block BLK in a core circuit of the memory chip.

As illustrated in FIG. 3, the memory chip 100 includes a core circuit 110, a peripheral circuit 120, an input output pad group 130(0), a logic control pad group 130(1), and a power supply pad group 130(2).

The peripheral circuit 120 includes an input output circuit 102, a logic control circuit 103, a register 104, and a sequencer 105.

The core circuit 110 includes a plurality of planes PB (two planes PB (PB(0) and PB(1) in FIG. 3)). Each of the planes PB(0) and PB(1) includes a memory cell array 101 (101_0 and 101_1), a voltage generation circuit 106 (106_0 and 106_1), a driver set 107 (107_0 and 107_1), a row decoder 108 (108_0 and 108_1), and a sense amplifier module 109 (109_0 and 109_1).

Each of the memory cell arrays 101_0 and 101_1 includes a plurality of blocks BLK (BLK(0), BLK(1), . . . ). The planes PB that are different from each other each include a set of blocks BLK having the same address ADD. The blocks BLK of the planes PB that are different from each other having the same address are distinguished by specifying the plane PB. The block BLK includes a plurality of non-volatile memory cell transistors (not illustrated) associated with word lines and bit lines. The block BLK is a, for example, a data erasing unit, and the data in the same block BLK is erased collectively. Each of the blocks BLK includes a plurality of string units SU (SU(0), SU(1), . . . ). The number of blocks in the memory cell array 101 and the number of string units in one block BLK may be set to any number.

The input output circuit 102 transmits and receives the signal DQ<7:0> to and from the controller 20. The input output circuit 102 transfers the command CMD and the address ADD in the signal DQ<7:0> to the register 104. The input output circuit 102 transmits and receives the write data and the read data to and from the sense amplifier module 109.

The logic control circuit 103 receives the signals CEn, CLE, ALE, WEn, REn, WPn from the controller 20. In addition, the logic control circuit 103 transfers the signal RBn to the controller 20 to notify the state of the memory chip 100 to the outside.

The register 104 stores the command CMD and the address ADD. The register 104 transfers the address ADD to the row decoder 108 and the sense amplifier module 109, and also transfers the command CMD to the sequencer 105.

The sequencer 105 receives the command CMD and controls the entire memory chip 100 according to a sequence based on the received command CMD. The sequencer 105 can perform operations to read data from each of the planes PB(0) and PB(1) in parallel, for example. The sequencer 105 is configured to be able to perform the reading operation from the plane PB(0) and the reading operation from the plane PB(1) either in a synchronized manner or in a non-synchronized manner when reading the data from each of the planes PB(0) and PB(1) in parallel.

The voltage generation circuit 106 generates a voltage required for operations such as data writing, reading, and erasing based on an instruction from the sequencer 105. Each of the voltage generation circuits 106_0 and 106_1 supplies the generated voltage to the driver sets 107_0 and 107_1.

Each of the driver sets 107_0 and 107_1 includes a plurality of drivers, and supplies various voltages from the voltage generation circuit 106_0 to the memory cell array 101_0, the row decoder 108_0, and the sense amplifier module 109_0 based on the address from the register 104, and supplies voltages from the voltage generation circuit 106_1 to the memory cell array 101_1, the row decoder 108_1, and the sense amplifier module 109_1.

The row decoder 108 receives the row address in the address ADD from the register 104, and selects the block BLK or the like based on the block address in the row address, for example. Then, the voltages from each of the driver sets 107_0 and 107_1 are transferred to the selected block BLK via the row decoders 108_0 and 108_1.

When reading the data, the sense amplifier module 109 senses the read data read from the memory cell transistor to the bit line, and transfers the sensed read data to the input output circuit 102. When writing the data, the sense amplifier module 109 transfers the write data written via the bit line to the memory cell transistor, which is located at a column address in the address ADD received from the register 104. In addition, the sense amplifier module 109 outputs the data of the memory cell transistor at the column address, to the input output circuit.

The input output pad group 130(0) transfers the signal DQ<7:0> received from the controller 20 to the input output circuit 102. In addition, the input output pad group 130(0) transfers the signal DQ<7:0> transmitted from the input output circuit 102 to the outside of the memory chip 100.

The logic control pad group 130(1) transfers the signals CEn, CLE, ALE, WEn, REn, and WPn received from the controller 20 to the logic control circuit 103. In addition, the logic control pad group 130(1) transfers the signal RBn transmitted from the logic control circuit 103 to the outside of the memory chip 100.

The power supply pad group 130(2) transfers the voltages VCC and VSS received from outside to the plane PB. Specifically, the power supply pad group 130(2) includes pads PAD_VCC and PAD_VSS. Each of the pads PAD_VCC and PAD_VSS supplies the voltages VCC and VSS into the memory chip 100.

FIG. 4 is a cross-sectional view illustrating a part of an area of the block BLK. In FIG. 4, the X direction is the direction in which the word lines extend, the Y direction is the direction in which the bit lines extend, and the Z direction is the stacking direction.

A p-type well area (p-well) 30 is provided in the semiconductor layer. A plurality of NAND strings NS are provided on the p-type well area 30. That is, on the well area 30, a wiring 31 that functions as a select gate line SGS, an 8-layer wiring 32 that functions as the word lines WL0 to WL7, and a wiring 33 that functions as the select gate line SGD are stacked in this order with insulating layers between the stacked wirings. In order to avoid the complication of the drawing, hatching of a plurality of insulating layers provided between the plurality of stacked wirings is omitted.

The memory hole 34 reaches the well area 30 through the wirings 31, 32 and 33. A pillar-shaped semiconductor layer (semiconductor pillar) 35 is provided in the memory hole 34. A gate insulating film 36, a charge storage layer 37 (which, for example, is an insulating layer), and a block insulating film 38 are sequentially provided on a side surface of the semiconductor pillar 35. Those films are parts of the memory cell transistor MT and the select transistors ST1 and ST2. The semiconductor pillar 35 is an area that functions as a current path of the NAND string NS, and is an area where a channel of each transistor is formed. An upper end of the semiconductor pillar 35 is connected to a metal wiring 40 that functions as the bit line BL, via a contact plug 39. A metal wiring 47 may be provided on a layer further above the metal wiring 40.

On the surface area of the well area 30, an n+ type diffusion area 41 into which a high concentration of n type impurities is introduced is provided. A contact plug 42 is provided on the diffusion area 41, and the contact plug 42 is connected to the metal wiring 43 that functions as the source line SL. Furthermore, on the surface area of the well area 30, a p+ type diffusion area 44 into which a high concentration of p type impurities is introduced is provided. A contact plug 45 is provided on the diffusion area 44, and the contact plug 45 is connected to a metal wiring 46 that functions as a well wiring CPWELL. The well wiring CPWELL is a wiring for supplying a voltage to the semiconductor pillar 35 via the well area 30.

A wiring layer M0, a wiring layer M1, and a wiring layer M2 are sequentially provided on the layer above (upward in the Z direction). The wirings 31, 32, and 33 that are stacked to form the NAND string NS. The metal wiring 43 and the metal wiring 46 are formed in the wiring layer M0. The metal wiring 40 is formed in the wiring layer M1. The metal wiring 47 is formed in the wiring layer M2. The wiring layers M0, M1, and M2 are internal wiring layers of the memory chip 100.

In addition, the metal wiring 48 may be provided in the layer above the upper surface of the memory chip 100 (upward in the Z direction). For example, the metal wiring 48 may be formed by a bonding wire, in which case it is an external wiring of the memory chip 100.

A plurality of the above-described configurations are arranged in the depth direction (Y direction) of the paper surface of FIG. 4, and a string unit SU includes a set of a plurality of NAND strings NS arranged in the Y direction.

1-2-5. Layout of Memory Chip

Figure 5:
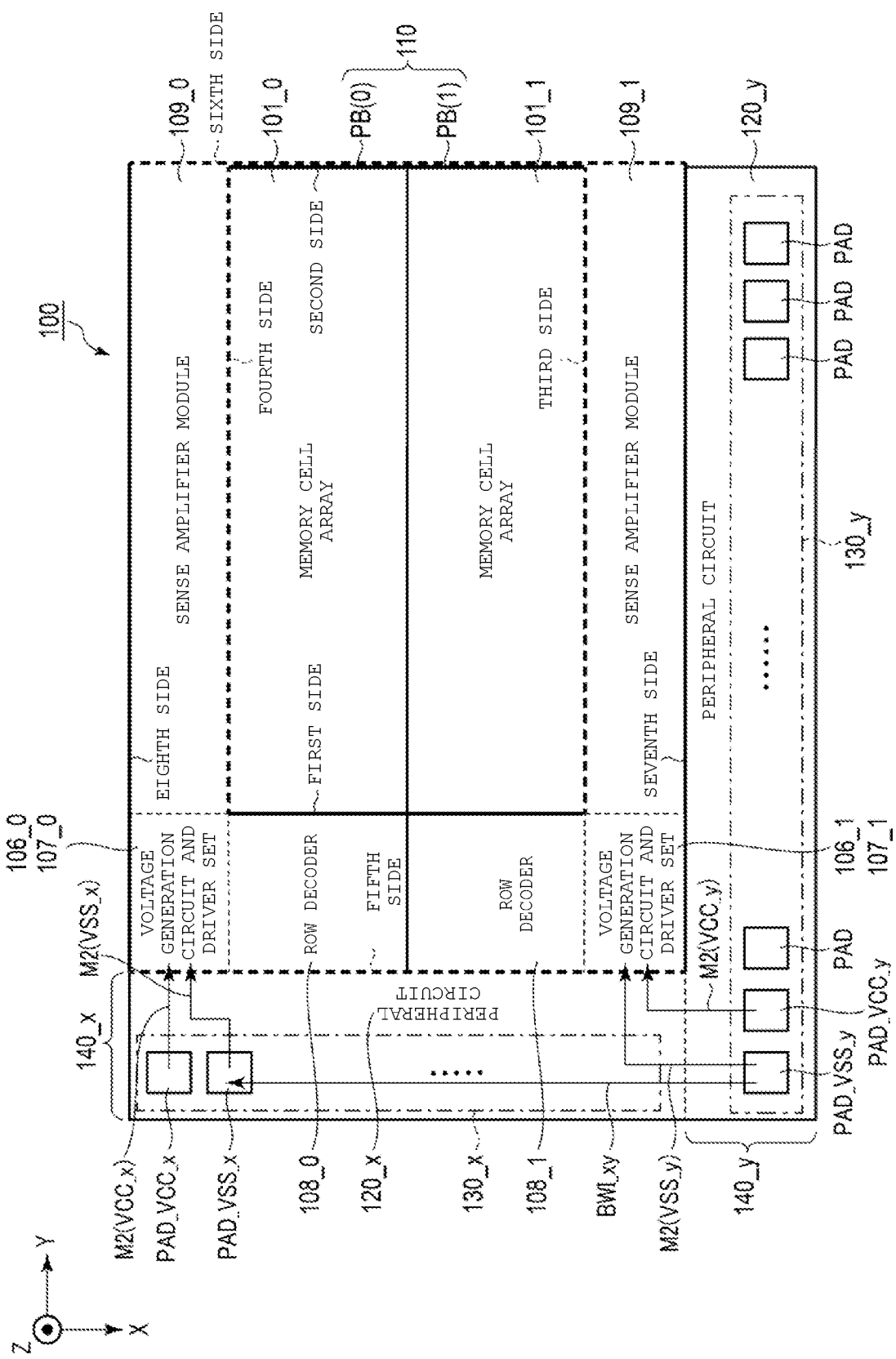
FIG. 5 is a plan view illustrating an outline of a layout of the memory chip according to the first embodiment.

FIG. 5 is a plan view illustrating an outline of a layout of the memory chip according to the first embodiment. In the description below, a plane parallel to a surface of a semiconductor substrate (not illustrated) on which the memory chip 100 is provided is an XY plane, and the direction orthogonal to the XY plane is the Z direction. In addition, the X direction and the Y direction are orthogonal to each other. The aspect ratio (ratio between the X-axis dimension and the Y-axis dimension) of the memory chip 100 in FIG. 5 is merely an example, and may be changed as appropriate. FIG. 5 illustrates an outline of the layout of the memory chip according to the first embodiment, and also illustrates positions of the bonding wires provided on the memory chip.

As illustrated in FIG. 5, the planes PB(0) and PB(1) are arranged, for example, along the X direction. The planes PB are symmetrically provided along the Y direction, for example.

The memory cell array 101 is provided, for example, in a rectangular shape having a first side and a second side extending in the X direction and a third side and a fourth side extending in the Y direction. The first side and the second side face each other, and the third side and the fourth side face each other.

The row decoders 108_0 and 108_1 are provided along the X direction so as to be adjacent to the first side of the memory cell array 101, for example.

The sense amplifier modules 109_0 and 109_1 extend along the Y direction so that one is adjacent to the third side and the other is adjacent to the fourth side of the memory cell array 101, for example.

One of the voltage generation circuits 106_0 and 106_1 and one of the driver sets 107_0 and 107_1 are provided in each area that is adjacent to the row decoder 108 in the X direction and to the sense amplifier module 109 in the Y direction.

Accordingly, the core circuit 110 including the planes PB(0) and PB(1) is provided, for example, in a rectangular shape having a fifth side and a sixth side extending in the X direction and a seventh side and a eighth side extending in the Y direction. The fifth side and the sixth side face each other, and the seventh side and the eighth side face each other.

A peripheral area 140_x that extends along the X direction is provided adjacent to the fifth side of the core circuit 110. In addition, a peripheral area 140_y that extends along the Y direction is provided adjacent to the seventh side of the core circuit 110. In the first embodiment, the peripheral area 140_x functions as a first area which is adjacent to the fifth side of the core circuit 110, extends in the X direction, and overlaps with the core circuit 110 when viewed in the Y direction. In addition, a part of the peripheral area 140_y functions as a second area which is adjacent to the sixth side of the core circuit 110, extends in the Y direction, and overlaps with the core circuit 110 when viewed in the X direction. Further, a remaining part of the peripheral area 140_y functions as a third area which is adjacent to the first area in the X direction, and is adjacent to the second area in the Y direction.

A short side of the peripheral area 140_x extends in the Y direction and is in contact with a part of a long side of the peripheral area 140_y, which extends in the Y direction. The peripheral area 140_x and the peripheral area 140_y are laid out so as to have an L-shape when viewed from above the XY plane in the Z direction.

The peripheral area 140_y includes a peripheral circuit 120_y and a pad group 130_y. The peripheral circuit 120_y is, for example, the peripheral circuit 120 for the plane PB(1). The pad group 130_y is provided with an input output pad group 130(0), a logic control pad group 130(1), and a power supply pad group 130(2) of the plane PB(1).

The peripheral area 140_x includes a peripheral circuit 120_x and a pad group 130_x. The peripheral circuit 120_x is, for example, the peripheral circuit 120 for the plane PB(0) adjacent to the peripheral area 140_x. The pad group 130_x is provided with a power supply pad group 130(2) for the plane PB(0).

The arrangement of pad groups is not limited to the descriptions above. For example, the peripheral area 140_x does not need to be provided with the peripheral circuit 120_x for the plane PB(0), and the peripheral circuit 120_y provided in the peripheral area 140_y may perform the control for the plane PB(0) and the control for the plane PB(1). Similarly, the peripheral area 140_y does not need to be provided with the peripheral circuit 120_y for the plane PB(1), and the peripheral circuit 120_x provided in the peripheral area 140_x may perform the control for the plane PB(0) and the control for the plane PB(1).

In addition, all or a part of the input output pad group 130(0) and the logic control pad group 130(1) may be provided in the pad group 130_x instead of the pad group 130_y.

The pads PAD_VCC and PAD_VSS in the pad group 130_y are labeled as PAD_VCC_y and PAD_VSS_y, respectively.

The pad PAD_VCC_y is connected to the voltage generation circuit 106_1 and the driver set 107_1 via a wiring M2(VCC_y) which is an internal wiring of the memory chip 100.

The pad PAD_VSS_y is connected to the voltage generation circuit 106_1 and the driver set 107_1 via a wiring M2(VSS_y) which is an internal wiring of the memory chip 100.

The pads PAD_VCC and PAD_VSS in the pad group 130_x are labeled as PAD_VCC_x and PAD_VSS_x, respectively.

The pad PAD_VCC_x is connected to the voltage generation circuit 106_0 and the driver set 107_0 via the wiring M2(VCC_x) which is an internal wiring of the memory chip 100. The pad PAD_VSS_x is connected to the voltage generation circuit 106_0 and the driver set 107_0 via the wiring M2(VSS_x) which is an internal wiring of the memory chip 100.

In addition, the pads PAD_VSS_y and PAD_VSS_x are connected to each other via a bonding wire BWI_xy which is an external wiring of the memory chip 100. The bonding wire BWI_xy is in a layer above the wiring layer M2 (which includes M2 (VCC_y), M2 (VSS_y), M2 (VCC_x), and M2 (VSS_x)) in the Z direction and has a low resistance.

As described above, the pad group 130_x and the pad group 130_y are arranged on two adjacent sides.

1-3. Package

Subsequently, the package will be described.

1-3-1. Plane of Package

Figure 6:
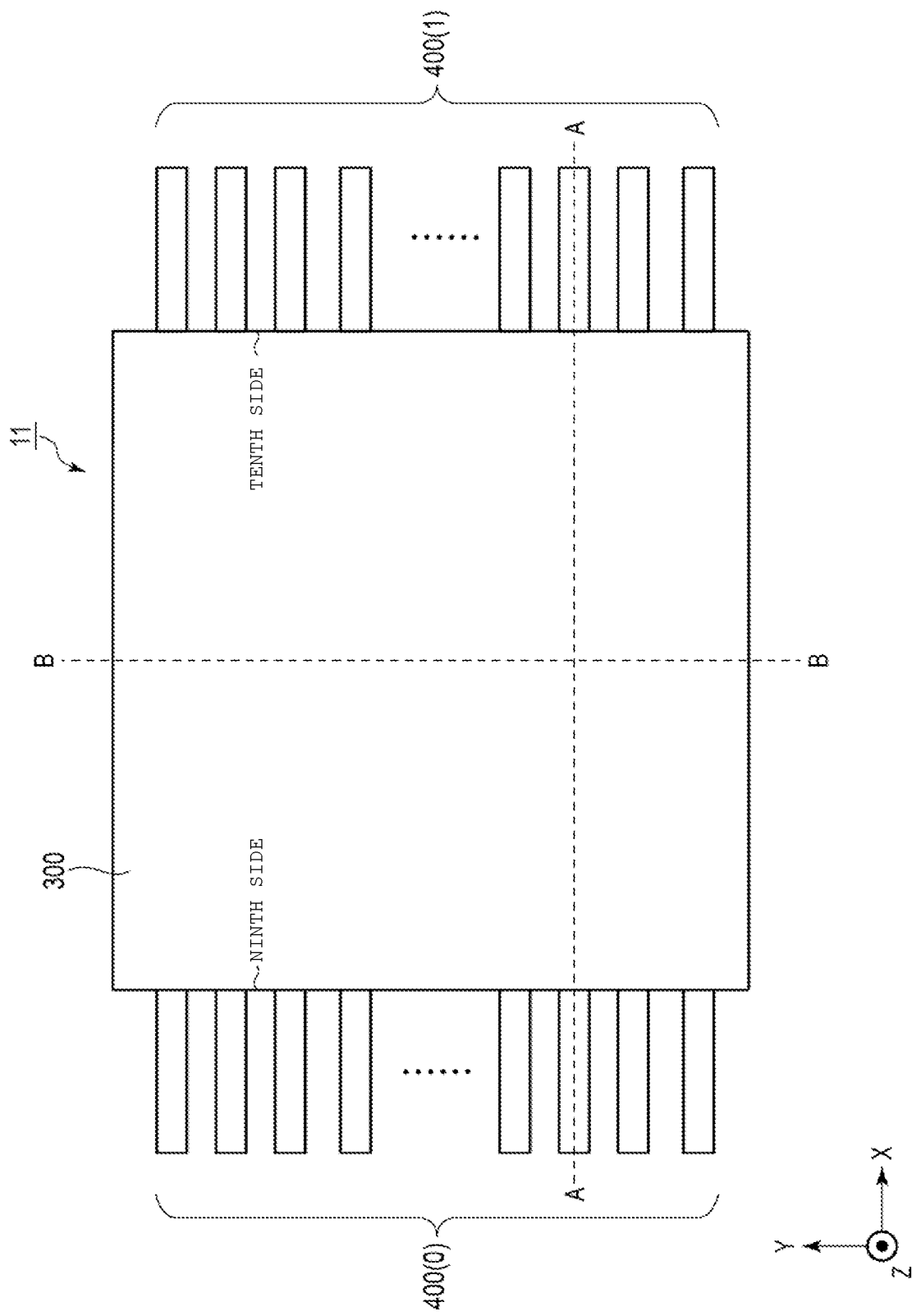
FIG. 6 is a plan view of the package.

The plane of the package according to the embodiments will be described with reference to FIG. 6. FIG. 6 is a plan view of the package.

The package 11 is, for example, a TSOP (thin small outline package) type. As illustrated in FIG. 6, the package 11 includes an encapsulating resin 300 and a lead frame 400.

The encapsulating resin 300 is, for example, epoxy resin or the like, and encapsulates a plurality of memory chips 100.

In addition, the lead frame 400 includes a plurality of leads extending in the X direction and arranged in the Y direction. In FIG. 6, among the two sides of the encapsulating resin 300 extending in the Y direction, the lead frame 400 protruding to the outside of the encapsulating resin 300 from a ninth side on the left side of the paper is labeled as 400(0). In addition, among the two sides of the encapsulating resin 300 extending in the Y direction, the lead frame 400 protruding to the outside of the encapsulating resin 300 from a tenth side on the right side of the paper is labeled as 400(1).

1-3-2. Cross-Section of Package

Figure 7:
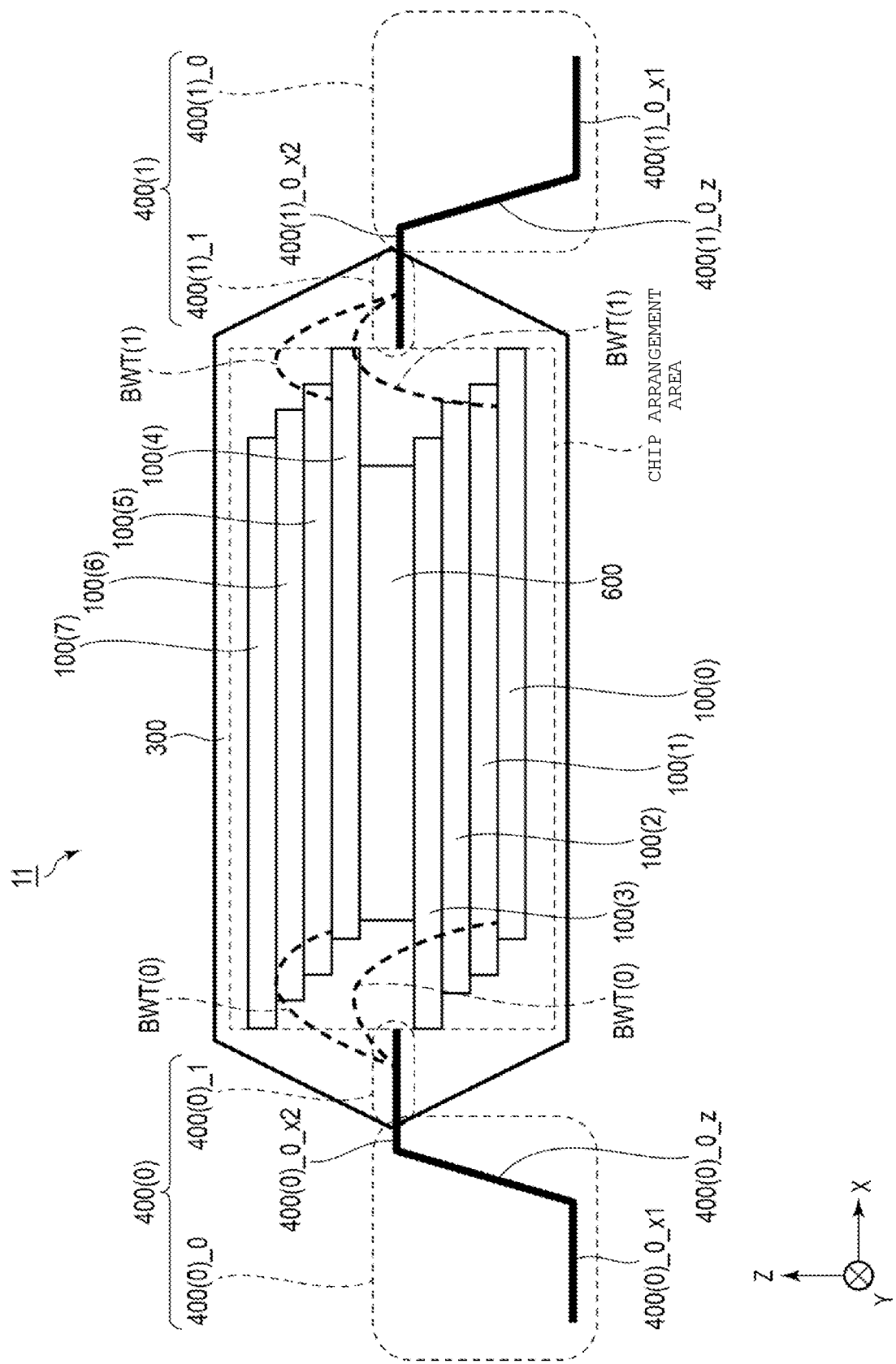
FIG. 7 is a cross-sectional view taken along the line A-A in FIG. 6.
Figure 8:
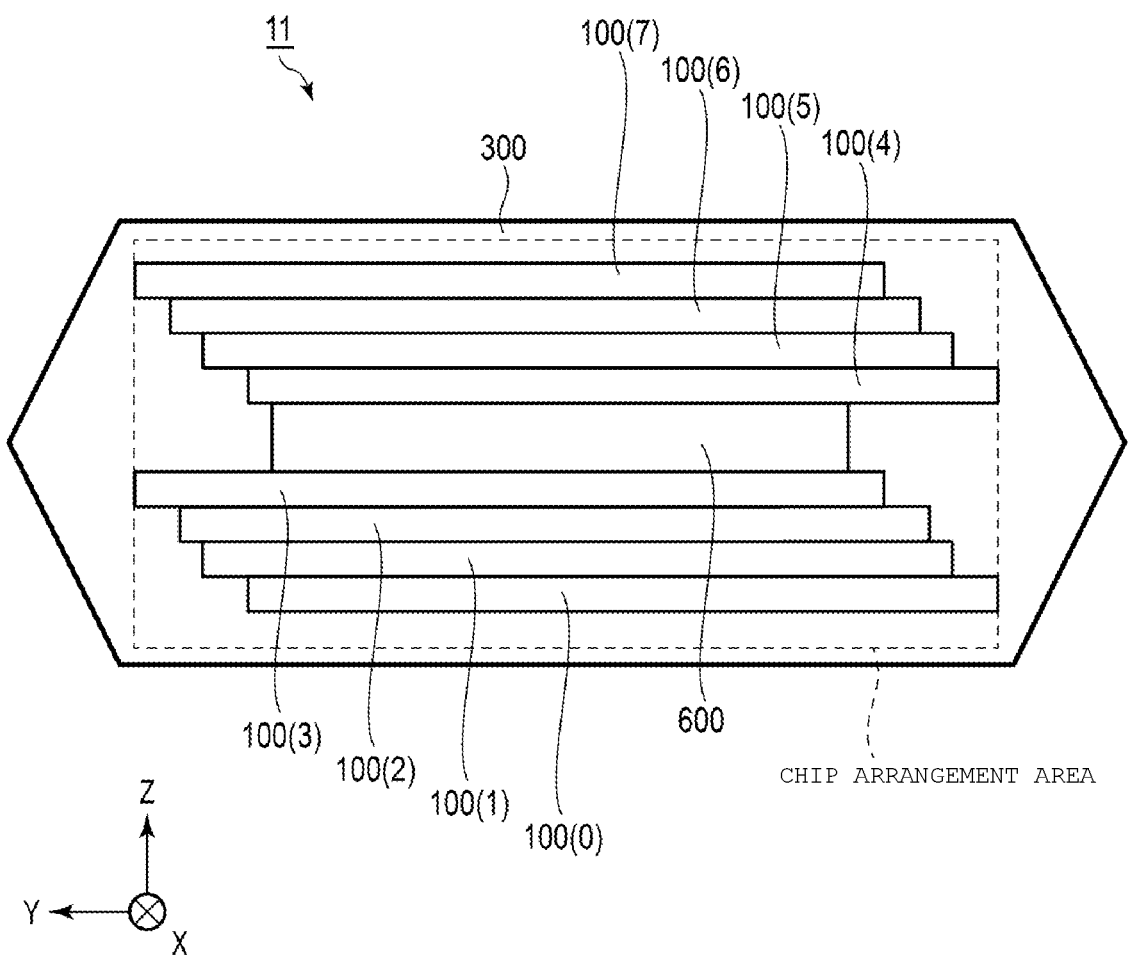
FIG. 8 is a cross-sectional view taken along the line B-B in FIG. 6.

Next, the cross section of the package according to an embodiment will be described with reference to FIG. 7 and FIG. 8. FIG. 7 is a cross-sectional view taken along the line A-A in FIG. 6. FIG. 8 is a cross-sectional view taken along the line B-B in FIG. 6.

As illustrated in FIG. 7, the lead frame 400(0) includes an outer lead frame 400(0)_0 and an inner lead frame 400(0)_1.

The outer lead frame 400(0)_0 includes a lead 400(0)_0_x1, a lead 400(0)_0_z, and a lead 400(0)_0_x2. The lead 400(0)_0_x1 extends in the X direction and is connected to a substrate (not illustrated) on which the package 11 is arranged. The lead 400(0)_0_z is connected to the lead 400(0)_0_x1 and extends in the Z direction. The lead 400(0)_0_x2 is connected to the lead 400(0)_0_z and extends in the X direction.

The inner lead frame 400(0)_1 is encapsulated in the encapsulating resin 300, connected to the leads 400(0)_0_x2, and connected to the memory chip 100 via a bonding wire BWT(0) extending in the X direction.

As illustrated in FIG. 7, the lead frame 400(1) includes an outer lead frame 400(1)_0 and an inner lead frame 400(1)_1.

The outer lead frame 400(1)_0 includes a lead 400(1)_0_x1, a lead 400(1)_0_z, and a lead 400(1)_0_x2. The lead 400(1)_0_x1 extends in the X direction and is connected to a substrate (not illustrated) on which the package 11 is arranged. The lead 400(1)_0_z is connected to the lead 400(1)_0_x1 and extends in the Z direction. The lead 400(1)_0_x2 is connected to the lead 400(1)_0_z and extends in the X direction.

The inner lead frame 400(1)_1 is encapsulated in the encapsulating resin 300, connected to the leads 400(1)_0_x2, and connected to the memory chip 100 via a bonding wire BWT(1) extending in the X direction.

As illustrated in FIG. 7 and FIG. 8, a plurality of memory chips are stacked.

In some cases, the chip arrangement area for stacking the memory chips may be limited depending on the specifications of the package 11. In addition, in some cases, when stacking the memory chips in the Z direction, it may be required to reduce the size on the XY plane footprint as much as possible in order to prevent the size of the entire package 11 from increasing. If the memory chips 100(0) to 100(7) are continuously shifted in one direction to be stacked, the dimension in the X direction and/or Y direction may increase, which may cause the XY plane footprint of the chip arrangement area to exceed a minimum specified dimension. Therefore, the plurality of memory chips 100 is divided into, for example, two sets, and the XY coordinates of each set may be adjusted so that the XY plane footprint of the chip arrangement area does not exceed the minimum specified dimension. In the examples in FIG. 7 and FIG. 8, the memory chips are divided into two sets: one set of four memory chips 100(0) to 100(3) and another set of four memory chips 100(4) to 100(7). Then, four memory chips 100(0) to 100(3) are continuously shifted in one direction to be stacked. A spacer 600 is provided on the uppermost layer memory chip 100(3) in the Z direction. Then, four memory chips 100(4) to 100(7) are continuously shifted in one direction to be stacked on the spacer 600.

The X-direction and Y-direction coordinates of the four memory chips 100(4) to 100(7) provided on the spacer 600 are the same as the XY coordinates of the four memory chips 100(0) to 100(3).

The outer lead frame and the inner lead frame are collectively referred to as a lead frame.

When simply indicating the bonding wire that connects the memory chip and the lead frame, the bonding wire is referred to as BWT.

1-3-3. Method of Stacking Memory Chips

Figure 9:
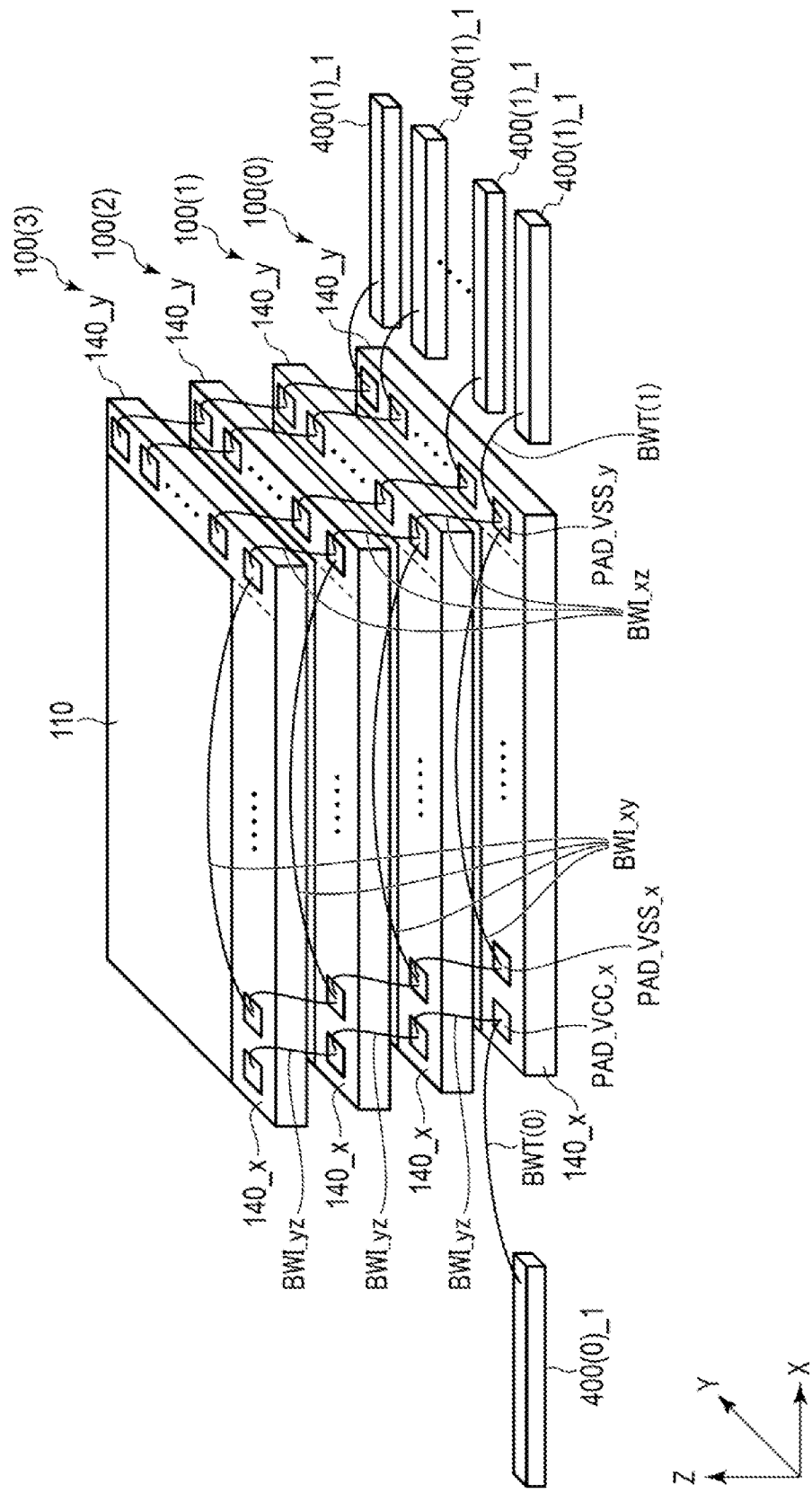
FIG. 9 is a perspective view of a stack structure in which memory chips are stacked.
Figure 10:
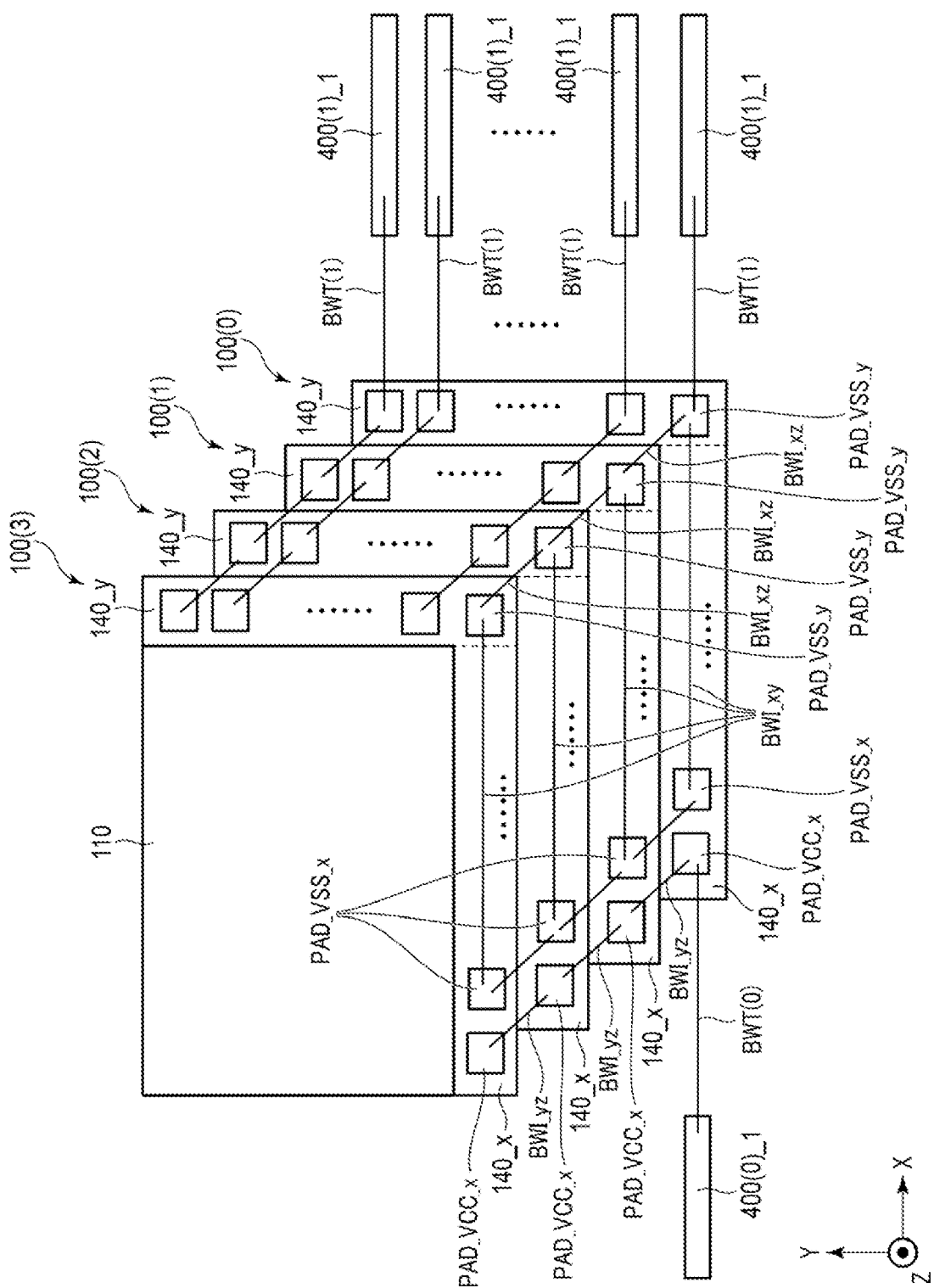
FIG. 10 is a plan view of FIG. 9.

Subsequently, a method of stacking the memory chips will be described with reference to FIG. 9 and FIG. 10. FIG. 9 is a perspective view of a stack structure in which the memory chips are stacked. FIG. 9 illustrates the memory chips 100(0) to 100(3). FIG. 10 is a plan view of FIG. 9. The method of stacking the memory chips 100(4) to 100(7) is the same as the method of stacking of the memory chips 100(0) to 100(3).

As illustrated in FIG. 9 and FIG. 10, the memory chips 100(0) to 100(3) are shifted with respect to the X direction and the Y direction, respectively.

Specifically, the memory chip 100(3) is arranged on the memory chip 100(2) to be offset in the X direction and the Y direction so that the peripheral area 140_y and the peripheral area 140_x of the memory chip 100(2) are not covered by the memory chip 100(3) in the Z direction. For example, the memory chip 100(3) is provided on a region of the core circuit 110 of the memory chip 100(2) via an adhesive (not illustrated).

In addition, the memory chips 100(3) and 100(2) are arranged on the memory chip 100(1) to be offset in the X direction and the Y direction so that the peripheral area 140_y and the peripheral area 140_x of the memory chip 100(1) are not covered by the memory chip 100(3) and 100(2) in the Z direction. For example, the memory chip 100(2) is arranged on a region of the core circuit 110 of the memory chip 100(1) via an adhesive.

In addition, the memory chips 100(3), 100(2), and 100(1) are arranged on the memory chip 100(0) to be offset in the X direction and the Y direction so that the peripheral area 140_y and the peripheral area 140_x of the memory chip 100(0) are not covered by the memory chip 100(3), 100(2), and 100(1) in the Z direction. For example, the memory chip 100(1) is arranged on a region of the core circuit 110 of the memory chip 100(0) via an adhesive.

As described above, the peripheral area 140_y and the peripheral area 140_x of each of the memory chips 100(0) to 100(3) are exposed in the Z direction. As a result, in the package 11, the exposed peripheral area 140_y and the exposed peripheral area 140_x of each of the memory chips 100(0) to 100(3) come into contact with the encapsulating resin 300.

When viewed from the Z direction, the memory chips 100(3), 100(2), and 100(1) may be offset in the same direction with respect to the memory chip 100(0) with equal offsets, but the arrangement is not limited thereto. For example, the offset direction and the offset amount may be different for each chip within a range that does not affect the connection to the bonding wire BWT described later.

First, the connection between the inner lead frame 400(0)_1 and the memory chip 100 will be described. The inner lead frame 400(0)_1 is connected to, for example, the pad provided in the peripheral area 140_x of the memory chip 100. In the example of FIG. 9 and FIG. 10, the inner lead frame 400(0)_1 is connected to the pad of the lowermost layer memory chip 100(0) among the memory chips 100(0) to 100(3) in the Z direction. Furthermore, specifically, the pad PAD_VCC_x to which the voltage VCC is supplied, and the inner lead frame 400(0)_1 are electrically connected to each other via the bonding wire BWT(0). The bonding wire BWT(0) extends in the X direction, and is made of, for example, gold.

Next, the connection between the inner lead frame 400(1)_1 and the memory chip 100 will be described. The inner lead frame 400(1)_1 is connected to, for example, the pad provided in the peripheral area 140_y of the memory chip 100. In the example of FIG. 9 and FIG. 10, the inner lead frame 400(1)_1 is connected to the pad of the lowermost layer memory chip 100(0) among the memory chips 100(0) to 100(3) in the Z direction. Furthermore, specifically, the pad PAD_VSS_y to which the voltage VSS is supplied, and the inner lead frame 400(1)_1 are electrically connected via the bonding wire BWT(1). The bonding wire BWT(1) extends in the X direction, and is made of, for example, gold.

Next, the bonding wires provided in the plurality of memory chips 100 will be described.

As illustrated in FIG. 9 and FIG. 10, the pads that belong to the peripheral areas 140_x between the memory chips stacked in the Z direction and have the same function are electrically connected to each other via the bonding wires BWI_yz. Specifically, the pad PAD_VCC_x in the peripheral area 140_x of the memory chip 100(0) is electrically connected to the pad PAD_VCC_x in the peripheral area 140_x of the memory chip 100(1) via the bonding wire BWI_yz. In addition, the pad PAD_VCC_x in the peripheral area 140_x of the memory chip 100(1) is electrically connected to the pad PAD_VCC_x in the peripheral area 140_x of the memory chip 100(2) via the bonding wire BWI_yz. The pad PAD_VCC_x in the peripheral area 140_x of the memory chip 100(2) is electrically connected to the pad PAD_VCC_x in the peripheral area 140_x of the memory chip 100(3) via the bonding wire BWI_yz. The same applies to the pads on other peripheral areas 140_x.

Furthermore, as illustrated in FIG. 9 and FIG. 10, the pads that belong to the peripheral areas 140_y of the memory chips stacked in the Z direction and have the same function are electrically connected to each other via the bonding wires BWI_xz. Specifically, the pad PAD_VSS_y in the peripheral area 140_y of the memory chip 100(0) is electrically connected to the pad PAD_VSS_y in the peripheral area 140_y of the memory chip 100(1) via the bonding wire BWI_xz. In addition, the pad PAD_VSS_y in the peripheral area 140_y of the memory chip 100(1) is electrically connected to the pad PAD_VSS_y in the peripheral area 140_y of the memory chip 100(2) via the bonding wire BWI_xz. The pad PAD_VSS_y in the peripheral area 140_y of the memory chip 100(2) is electrically connected to the pad PAD_VSS_y in the peripheral area 140_y of the memory chip 100(3) via the bonding wire BWI_xz. The same applies to the pads on other peripheral areas 140_y.

Furthermore, in the present embodiment, as illustrated in FIG. 9 and FIG. 10, the pad provided in the peripheral area 140_x and the pad provided in the peripheral area 140_y in the same memory chip 100 may be connected by the bonding wire. Specifically, the pad PAD_VSS_y in the peripheral area 140_y of the memory chip 100(0) is electrically connected to the pad PAD_VSS_x in the peripheral area 140_x of the memory chip 100(0) via the bonding wire BWI_xy. The pad PAD_VSS_y in the peripheral area 140_y of the memory chip 100(1) is electrically connected to the pad PAD_VSS_x in the peripheral area 140_x of the memory chip 100(1) via the bonding wire BWI_xy. The pad PAD_VSS_y in the peripheral area 140_y of the memory chip 100(2) is electrically connected to the pad PAD_VSS_x in the peripheral area 140_x of the memory chip 100(2) via the bonding wire BWI_xy. The pad PAD_VSS_y in the peripheral area 140_y of the memory chip 100(3) is electrically connected to the pad PAD_VSS_x in the peripheral area 140_x of the memory chip 100(3) via the bonding wire BWI_xy. That is, the package 11 includes the bonding wires that connect the stacked memory chips 100 to each other and the bonding wires that connect the pads of the same memory chips 100.

According to the plurality of memory chips 100 described above, the bonding wire to the lead frame extends in the X direction. Since the lead frame also extends in the X direction, it is possible to properly connect the bonding wire and the lead frame. In other words, the bonding wires from the plurality of memory chips 100 to the lead frame appear on both sides along the X direction in the peripheral area 140_x.

Here, the set of memory chips 100(0) to 100(3) arranged below the spacer 600 has been described, but in terms of positional relationship on the XY plane, the memory chips 100(4) to 100(7) arranged above the spacer 600 are the same as the memory chips 100(0) to 100(3) except that the coordinates in the Z direction are different. Therefore, the detailed explanation thereof will be omitted.

If the pad in any one of the memory chips 100(0) to 100(3) and the pad having the same function in any one of the memory chips 100(4) to 100(7) are electrically connected to each other, the pads having the same function in all the memory chips 100(0) to 100(7) in the package 11 will be connected to each other. As a result, all the memory chips 100(0) to 100(7) in the package 11 can be driven by supplying a single-system signal and/or power supply.

In the present embodiment, as illustrated in FIG. 7, the lowermost layer memory chip 100(0) of the set of memory chips 100(0) to 100(3) and the lowermost layer memory chip 100(4) of the memory chips 100(4) to 100(7) are connected to the lead frames 400(0) and 400(1) by the bonding wires BWT(0) and BWT(1), respectively. Therefore, in the present embodiment, all the memory chips 100(0) to 100(7) in the package 11 are driven by the single system signal and/or power supply.

The connection between the set of memory chips 100(0) to 100(3) and the set of memory chips 100(4) to 100(7) is not limited to the example described above. For example, in the set of memory chips 100(0) to 100(3) arranged below the spacer 600 and the set of memory chips 100(4) to 100(7) arranged above the spacer 600, the stacking directions may be opposite. In addition, the signal and/or power system may be divided into one set for the memory chips 100(0) to 100(3) and another set for the memory chips 100(4) to 100(7) to supply the signal and/or the power from the different directions. In this case, the memory chips 100 in the package 11 are driven by the signals and/or power supplies by different systems. That is, the memory chips 100 in the package 11 are driven by two systems of signals and/or power supplies.

Figure 11:
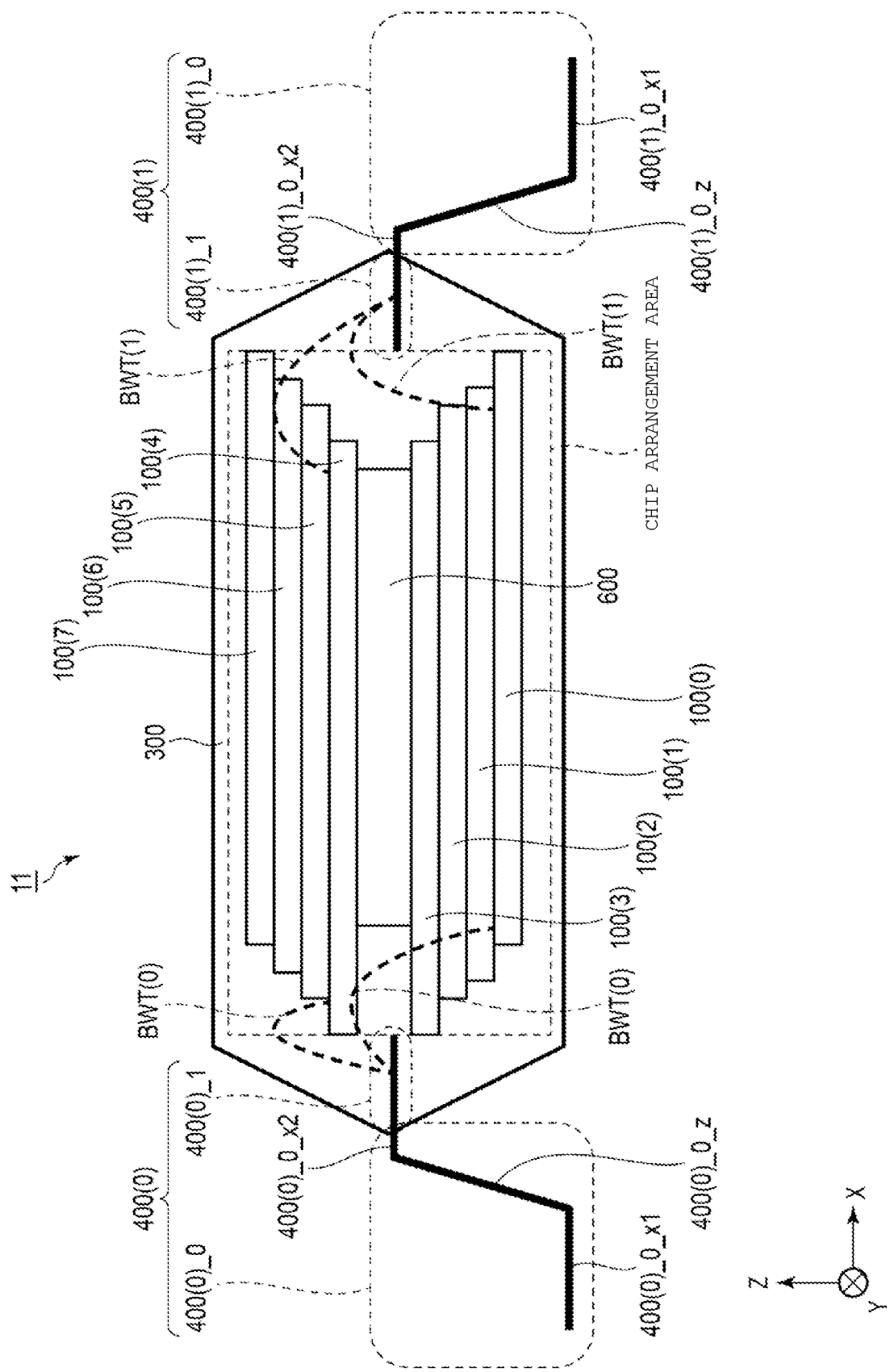
FIG. 11 is a cross-sectional view of the package in which a stack structure of the memory chips is modified.
Figure 12:
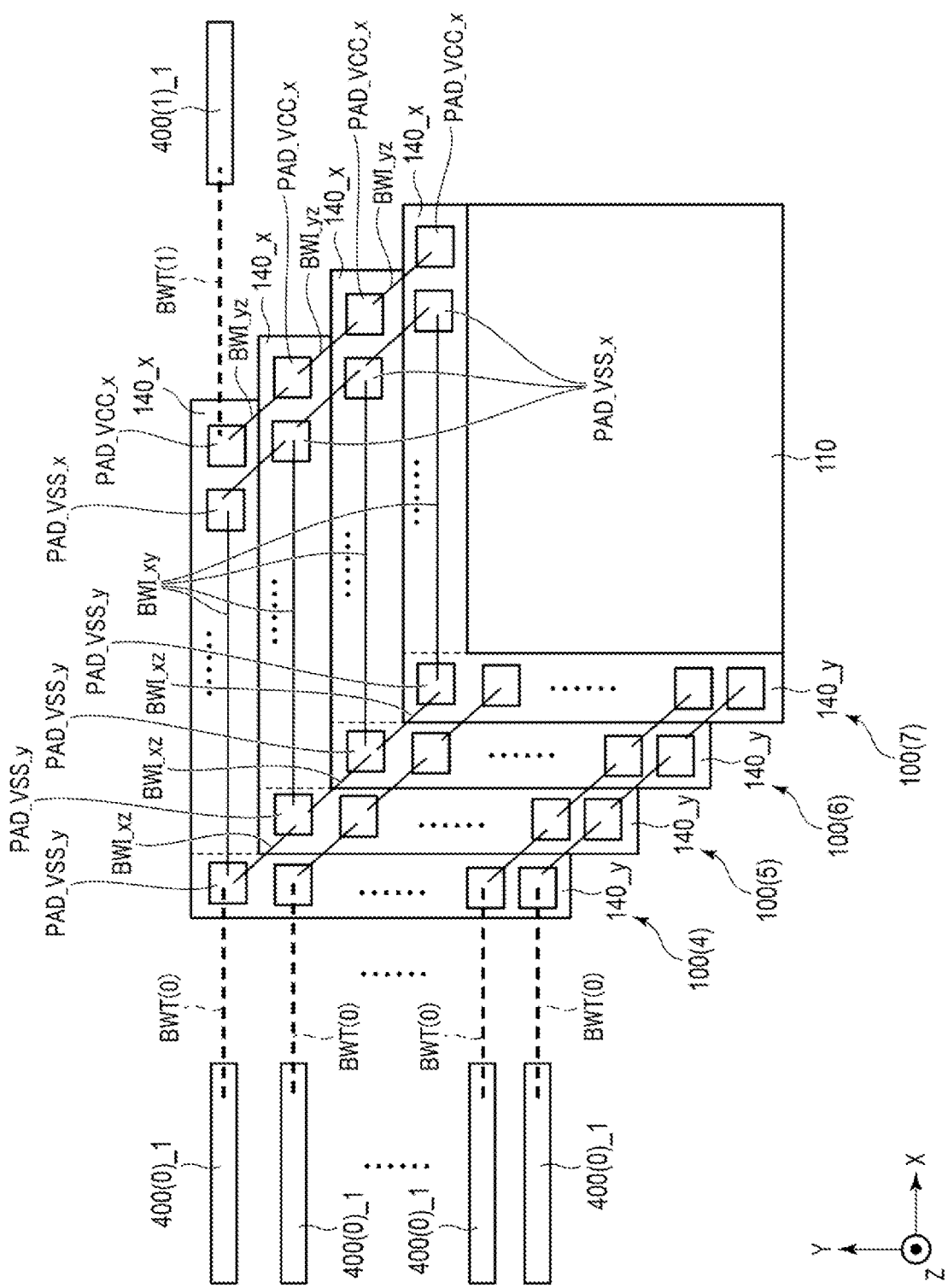
FIG. 12 is a plan view of the memory chips having the modified stack structure.
Figure 13:
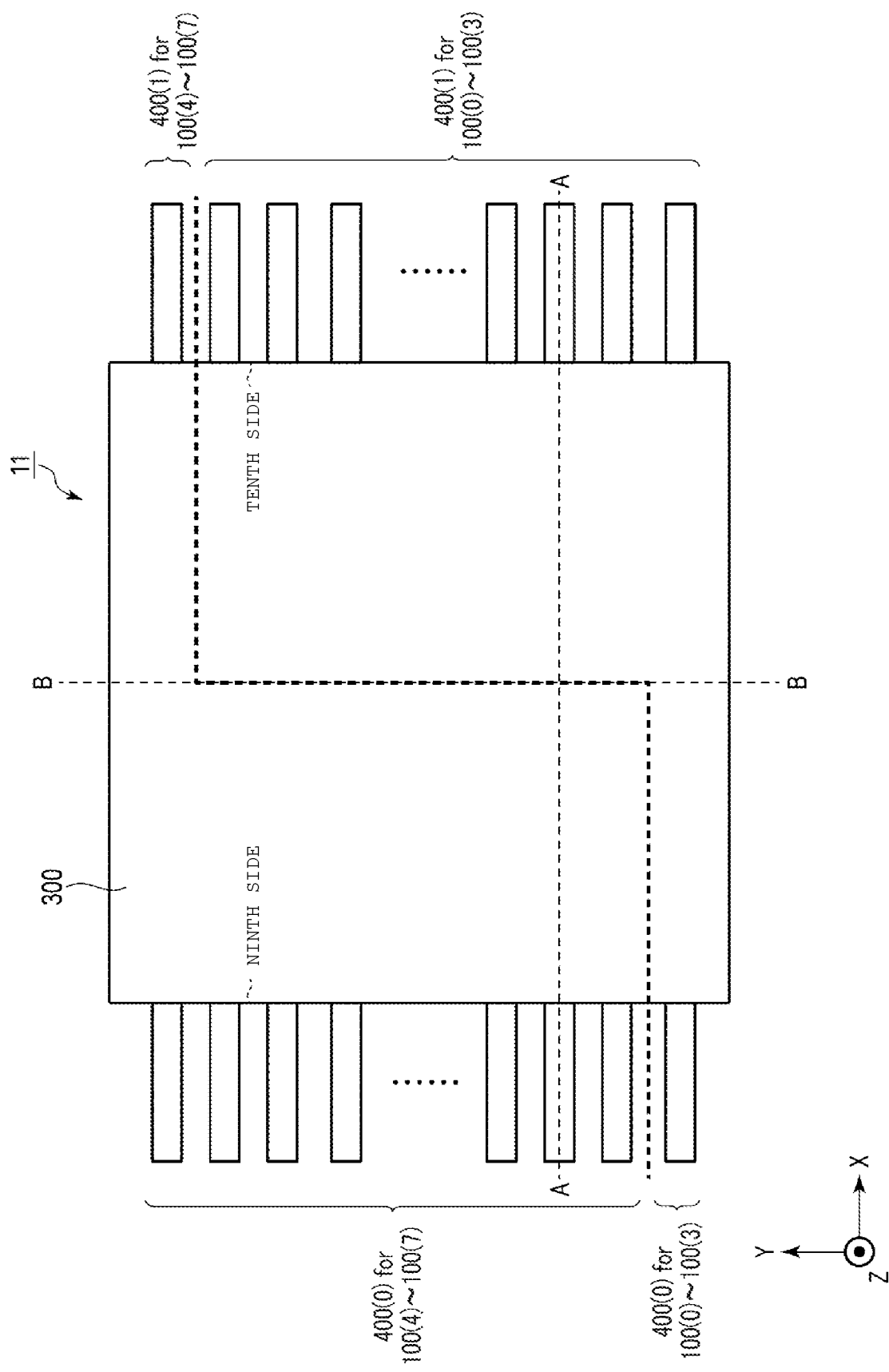
FIG. 13 is a plan view of the package in which the stack structure of the memory chips is modified.

An example of reversing the stacking directions of the set of memory chip 100(0) to 100(3) and the set of memory chips 100(4) to 100(7) and supplying the signal and/or power from two systems is illustrated in FIG. 11, FIG. 12 and FIG. 13. In this case, as illustrated in FIG. 11 and FIG. 12, the stacking direction in the set of memory chips 100(4) to 100(7) and the stacking direction in the set of memory chips 100(0) to 100(3) (illustrated in FIG. 7 and FIG. 10 are opposite each other. In addition, the connection direction of the memory chip 100(4) with the bonding wire BWT and the lead frame 400 is opposite to the connection direction of the memory chip 100(0) with the bonding wire BWT and the lead frame 400 with respect to the X direction. As a result, as illustrated in FIG. 13, two-system signals and/or power sources can be efficiently arranged so as to be point-symmetrical with respect to the lead frames 400(0) and 400(1) of the package 11 when viewed from the Z direction.

In the present embodiment, a case where eight memory chips 100 are stacked in the package 11 is described, however, the number of stacked memory chips 100 is not limited thereto and may be changed as appropriate.

In addition, a bonding wire that connects pads in a memory chip is labeled as BWI.

1-4. Effects

According to the above-described embodiment, in the package including a plurality of memory chips, each of the memory chips is provided with pads in the L-shaped area that is made of a first area (for example, a peripheral area 140_x) which is adjacent to the fifth side of the core circuit 110 and is extending along the X direction, a second area (for example, a part of the peripheral area 140_y) which is adjacent to the sixth side of the core circuit 110 and is extending along the Y direction, and a third area (for example, the remaining part of the peripheral area 140_y) which is adjacent to the first area in the X direction and is adjacent to the second area in the Y direction. Then, in the same memory chip, the pad provided in the first area and the pad provided in the third area are electrically connected by the bonding wire. In addition, a plurality of memory chips are stacked so that they are offset in the X direction and the Y direction. In addition, the bonding wires connecting the plurality of memory chips and the lead frames are only the wires extending in the X direction.

Figure 14:
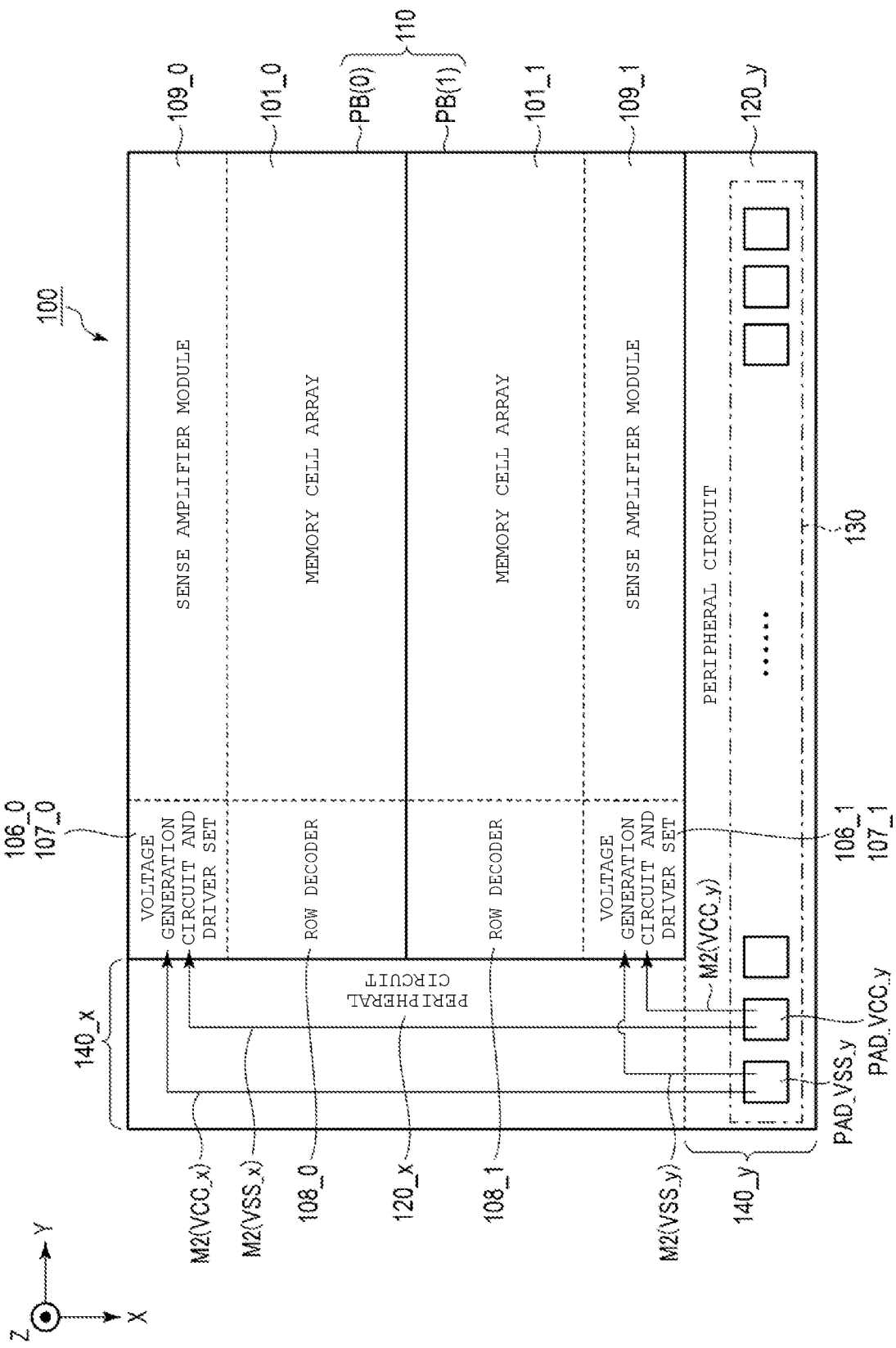
FIG. 14 is a plan view illustrating an outline of a layout of the memory chip according to a comparison example.

Hereinafter, a comparison example will be described with reference to FIG. 14 in order to describe the effects of the present embodiment. FIG. 14 is a plan view illustrating an outline of a layout of a memory chip according to a comparison example.

As illustrated in FIG. 14, in the comparison example, the pad is provided only on one side of the memory chip 100, for example. In such a case, it is necessary to provide wirings (M2(VCC_x) and M2(VSS_x)) in order to supply the voltage VCC and VSS to the plane PB(0) that is far from the pad. For example, since a peripheral circuit is provided in the area where the wirings (M2(VCC_x) and M2(VSS_x)) are provided, the layout of the wirings (M2 (VCC_x) and M2(VSS_x)) may be complicated. Therefore, the area may be increased to form the wirings (M2(VCC_x) and M2(VSS_x)). In addition, as the lengths of the wirings (M2(VCC_x) and M2(VSS_x)) increase, the voltage supplied to the plane PB(0) becomes unstable due to the influence of the resistance of the wirings (M2(VCC_x) and M2(VSS_x)), and thus, the voltage drop or the like may occur. In addition, in order to stabilize the voltage, it may be necessary to configure the wirings M2(VCC_x) and M2(VSS_x) to have a larger width so that the wirings M2(VCC_x) and M2(VSS_x) have a low resistance. However, the area required for arranging the wirings M2(VCC_x) and M2(VSS_x) may increase, and as a result, the area of the memory chip 100 may increase.

On the other hand, according to the present embodiment, the pads are provided along the two sides of the memory chip 100. Furthermore, in the same memory chip, a plurality of pads to which the same signal is input or to which the same voltage is supplied are connected by the bonding wires. Then, such memory chips are stacked. This bonding wire has a lower resistance than the wirings M2(VCC_x) and M2(VSS_x) provided in the memory chip 100. In addition, unlike the wirings M2(VCC_x) and M2(VSS_x), the bonding wire can perform the connection linearly. Therefore, even when the voltage is transferred to the plane PB(0) far from the pad, a low resistance wiring path can be achieved. In addition, since it is not necessary to increase the widths of the bonding wires, it is possible to prevent the area of the memory chip 100 from increasing.

In addition, since the pads are provided on two sides of the memory chip 100, unlike the comparison example, it is possible to extend the bonding wire that is extending in the X direction from the two sides of the memory chip 100 along the Y direction, and can connect the bonding wire to the lead frame. Therefore, in the present embodiment, unlike the comparison example, it is possible to shorten the distance of the wiring of the voltage supply that extends from the lead frame to the plane PB(0).

In other words, in the present embodiment, it is possible to supply a stable voltage to all the planes while minimizing the area of the memory chip.

Both pads connected by the bonding wire BWI may be connected by the internal wiring of the memory chip 100. In this case, the bonding wire BWI is electrically parallel to the wiring path by the internal wiring of the memory chip 100, and functions as a parallel wiring path for further reducing the resistance of the wiring path.

In addition, among a plurality of pads having the same functions of a plurality of memory chips 100 provided in the package 11, at least one pad is connected to the lead frame via the bonding wire BWT. In addition, that pad is connected to the pad in the same memory chip having the same function via the bonding wire BWI.

In addition, on one side (for example, the peripheral area 140_x) of the memory chip 100, two power supply pads having the same function are arranged. These two power supply pads may be arranged near both ends of the one side in a lengthwise direction thereof, respectively. In other words, these two power supply pads are arranged across the center point of the one side in the lengthwise direction thereof. Then, these two power supply pads are connected by the bonding wire.

In addition, in the first embodiment described above, a case where the voltages VCC and VSS are input to the memory chip 100 as the reference voltages has been described, but other reference voltages may be input.

Further, in the same memory chip 100, the two pads PAD_VSS_x and PAD_VSS_y to which the voltage VSS is supplied are connected by the bonding wire BWI_xy. Alternatively or additionally, in the same memory chip 100, two pads to which the same voltage other than the voltage VSS is supplied or to which the same signal is input may be connected by the bonding wire BWI in a similar manner. Further, three or more pads to which the same voltage is supplied or to which the same signal is input may be connected by two or more bonding wires BWI.

2. Second Embodiment

Subsequently, a second embodiment will be described. In the second embodiment, a bonding wire drawn to the inner lead from the memory chip will be described. The description of the same components as those in the above-described embodiment will be omitted. In addition, the second embodiment can be combined with the first embodiment.

2-1. Method of Connecting Bonding Wires

Figure 15:
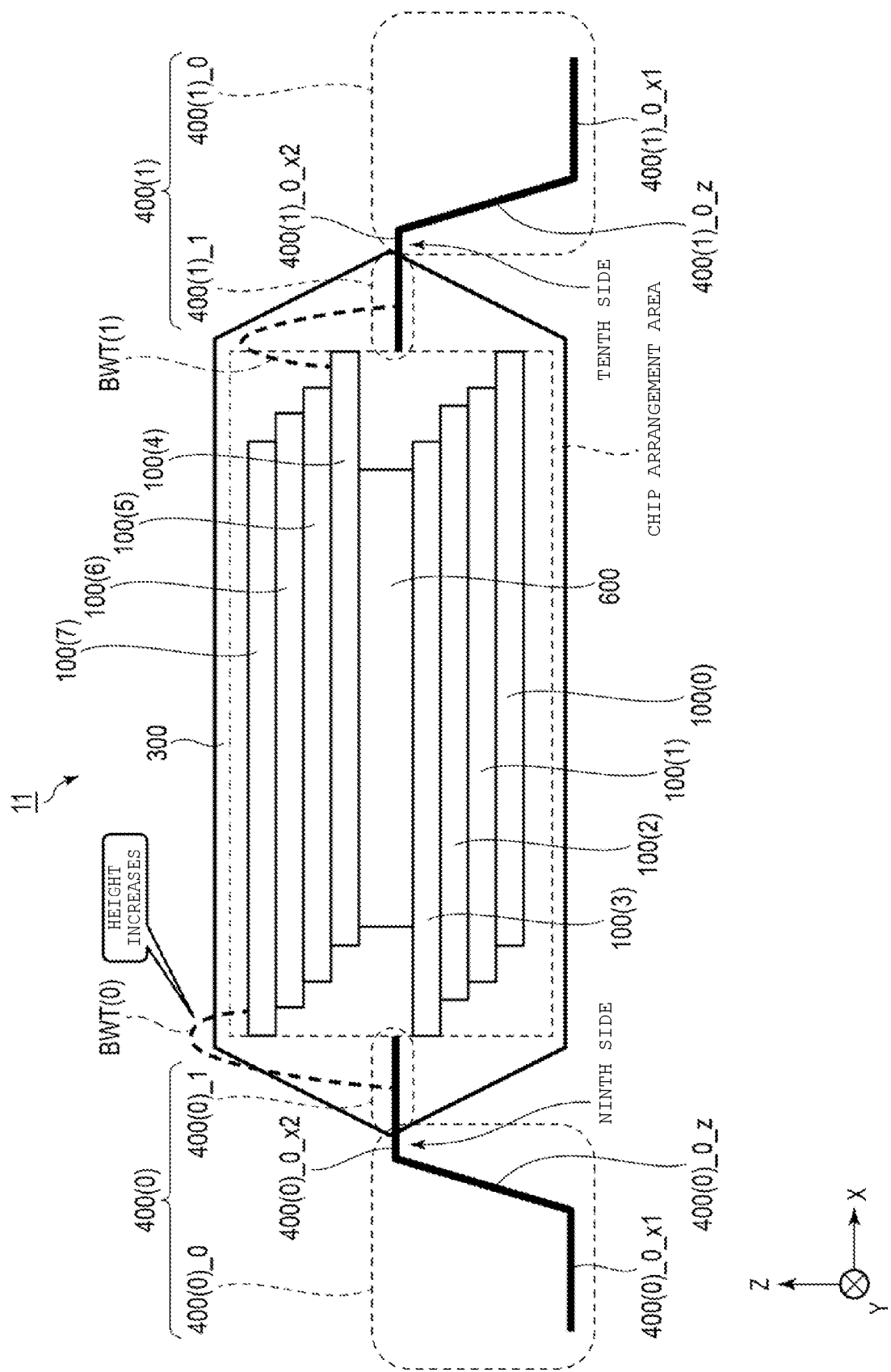
FIG. 15 is a cross-sectional view of a package according to a second embodiment, taken along the line A-A in FIG. 6.

The restriction for the bonding wire will be described with reference to FIG. 15. FIG. 15 is a cross-sectional view taken along the line A-A in FIG. 6.

As described above, in the package 11, a plurality of memory chips 100 are provided in the chip arrangement area. However, it is also necessary to pay attention to the arrangement of the bonding wires. As illustrated in FIG. 15, the bonding wire BWT shows an arc in the Z direction.

For example, when the bonding wire is directly connected to the lead frame from the memory chip 100 provided in the vicinity of the end portion of the chip arrangement area in at least one of the X direction, Y direction, and Z direction, an amount of protrusion of the bonding wire in the Z direction increases, which may cause an increase in the size of the encapsulating resin 300. In the package 11 described in the first embodiment, the plurality of memory chips 100 are stacked so that the pads are exposed. Therefore, the upper-layer memory chip in the Z direction is arranged at the end portion of the memory chip arrangement area. Therefore, it is necessary to provide a bonding wire for connecting to the lead frame while taking the relationship between the position of the memory chip and the chip arrangement area into consideration.

Figure 16:
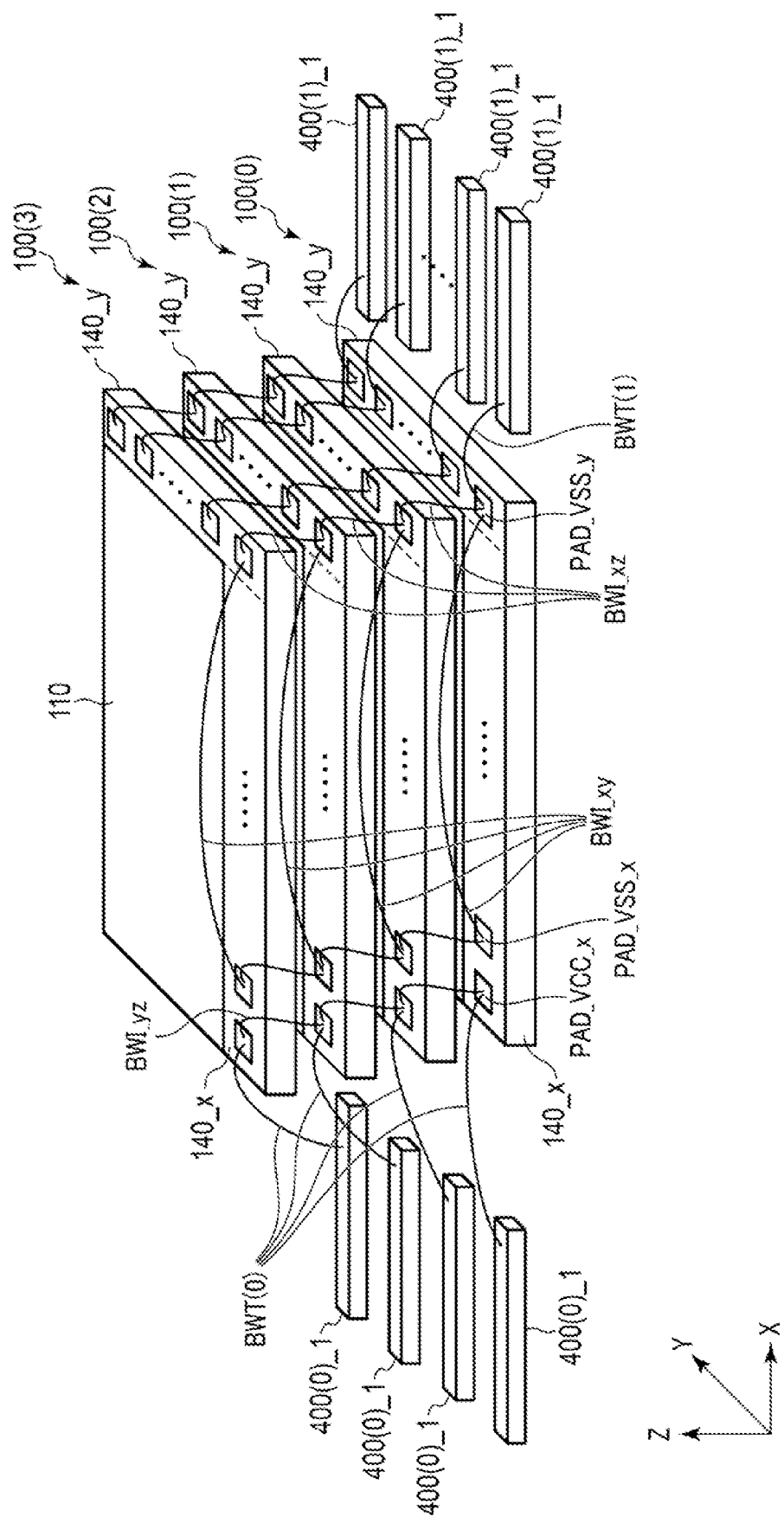
FIG. 16 is a perspective view of a stack structure in which memory chips are stacked and a first bonding wire arrangement of the second embodiment.
Figure 17:
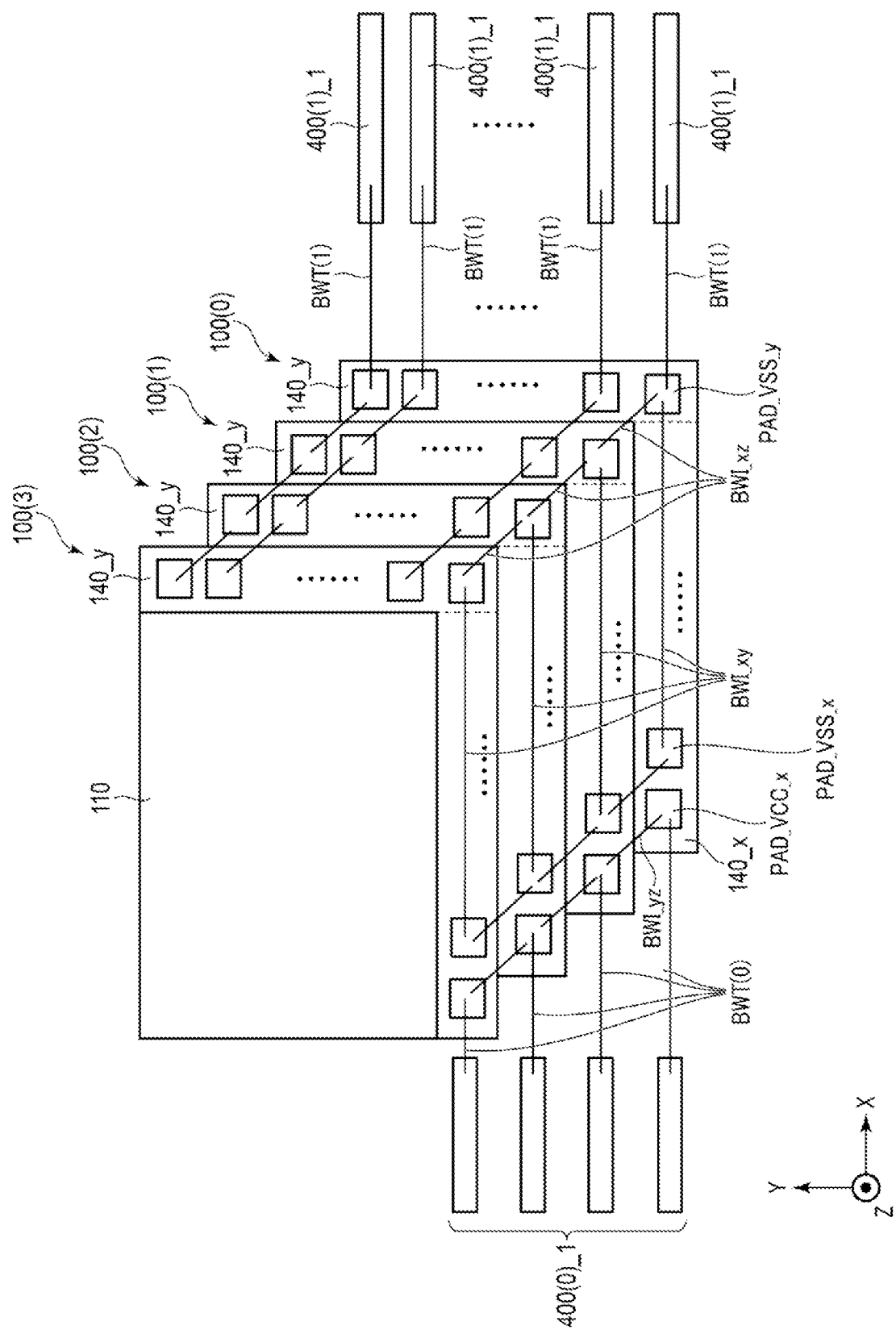
FIG. 17 is a plan view of FIG. 16.
Figure 18:
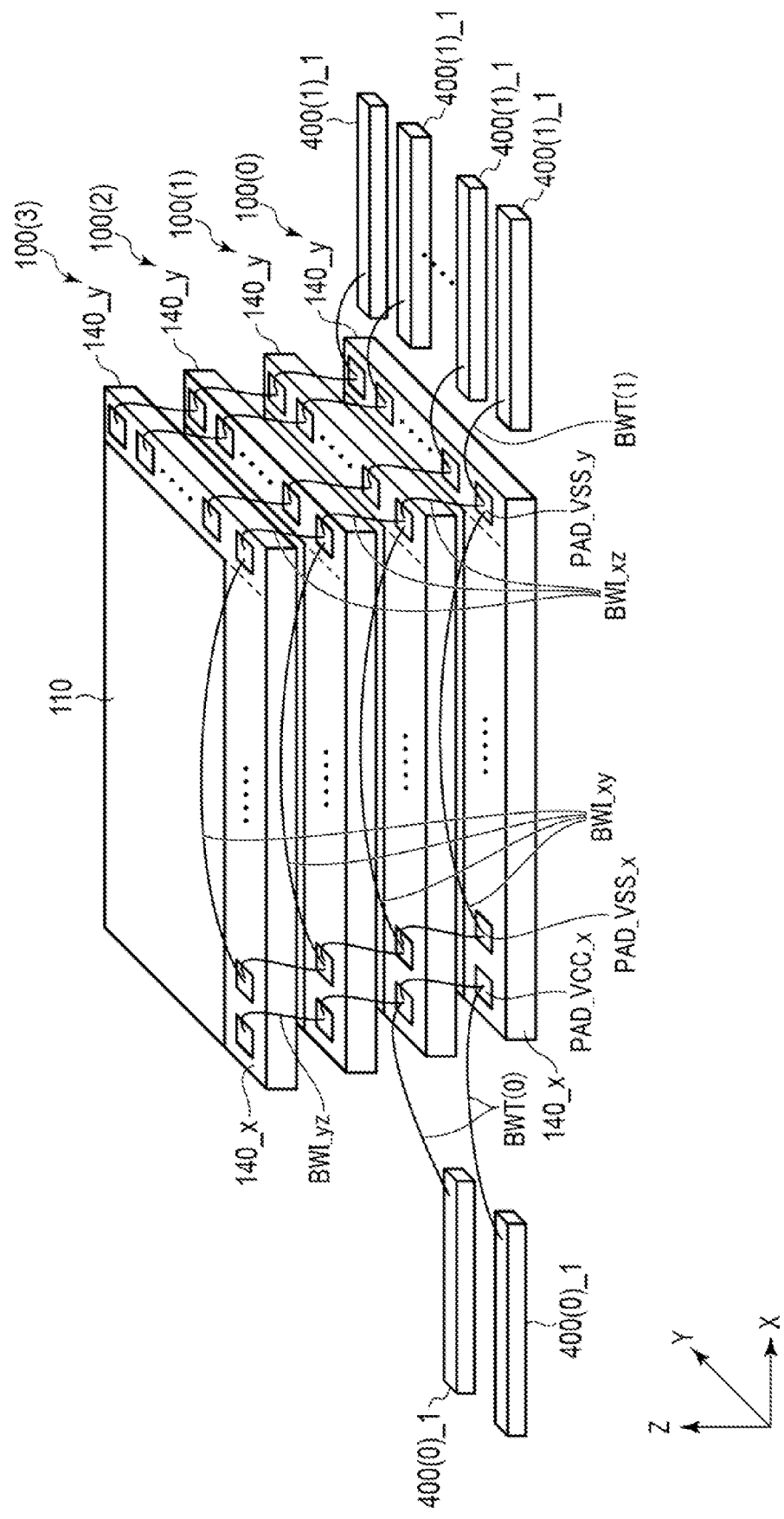
FIG. 18 is a perspective view of a stack structure in which memory chips are stacked and a second bonding wire arrangement of the second embodiment.
Figure 19:
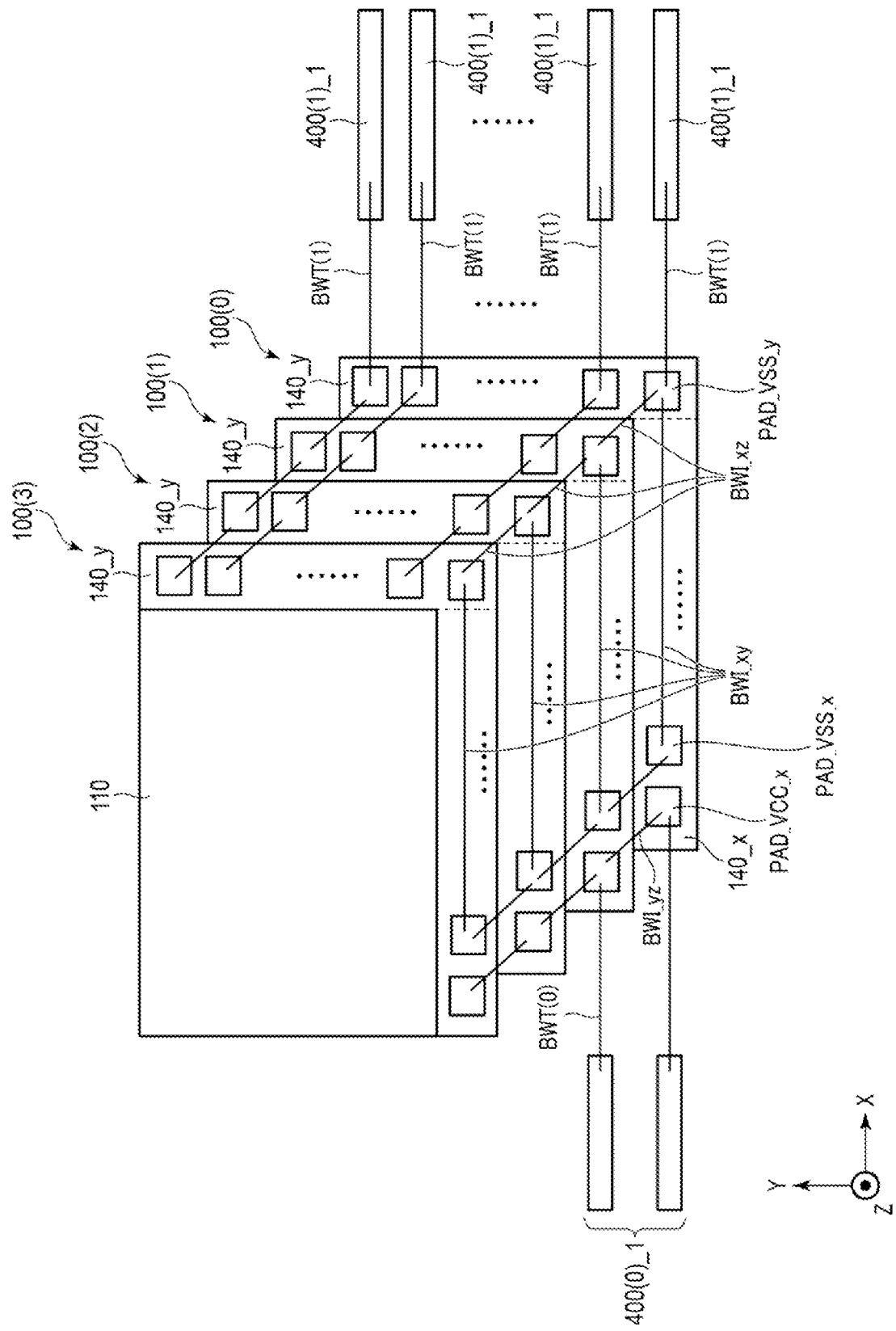
FIG. 19 is a plan view of FIG. 18.

Next, an example of connecting the bonding wire will be described with reference to FIG. 16 to FIG. 19. FIG. 16 is a perspective view of the stack structure in which the memory chips are stacked. FIG. 17 is a plan view of FIG. 16. FIG. 18 is a perspective view of the stack structure in which the memory chips are stacked. FIG. 19 is a plan view of FIG. 18.

For example, when there is a margin in the chip arrangement area, as illustrated in FIG. 16 and FIG. 17, the bonding wires may be directly connected to the lead frame from all the memory chips.

In addition, as illustrated in FIG. 18 and FIG. 19, the bonding wire may be provided only at a place having the margin to provide the bonding wires. Specifically, the pad PAD_VCC_x of the memory chip 100(0) and the pad PAD_VCC_x of the memory chip 100(1) are connected to the lead frame, while the pad PAD_VCC_x of the memory chip 100(2) and the pad PAD_VCC_x of the memory chip 100(3) are not connected to the lead frame.

2-2. Effects

In the first embodiment, as shown in FIG. 10, while the lowermost one 100(0) of the stacked memory chips 100 in the Z direction is directly connected the lead frame 400(0) and the lead frame 400(1) at the both sides in the X direction, the remaining memory chips 100(1), 100(2) and 100(3) are not directly connected to the lead frame 400(0) and the lead frame 400(1). On the other hand, according to the second embodiment, as shown in FIG. 17, while the lowermost one 100(0) of the stacked memory chip 100 in the Z direction is directly connected to the lead frame 400(1) via the bonding wire from the tenth side (the right side of FIG. 15) and to the lead frame 400(0) from the ninth side (the left side of FIG. 15), the remaining memory chips 100(1), 100(2) and 100(3) are also directly connected to the respective lead frames 400(0) and the lead frame 400(1) from the ninth side.

3. Third Embodiment

Subsequently, a third embodiment will be described. In the third embodiment, a bonding wire that connects a plurality of pads in the same memory chip will be described. The description of the same components as those in the above-described embodiment will be omitted. In addition, the third embodiment can be combined with the first and the second embodiments.

3-1. Layout of Chips

In the present embodiment, the description be focused on one memory chip 100.

In the first embodiment, in the memory chip 100, the bonding wires connecting the pads within the same memory chip include only the bonding wires connecting the pads PAD_VSS_x and pad PAD_VSS_y. However, it is not limited thereto.

Figure 20:
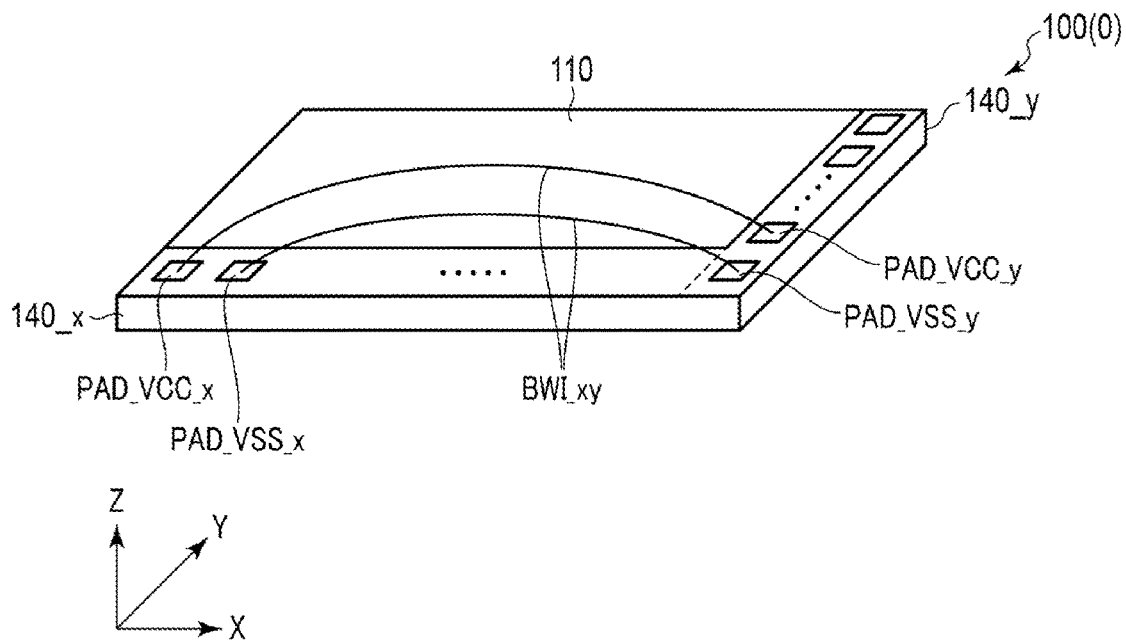
FIG. 20 is a perspective view of the memory chip that depicts a bonding wire arrangement according to a third embodiment.
Figure 21:
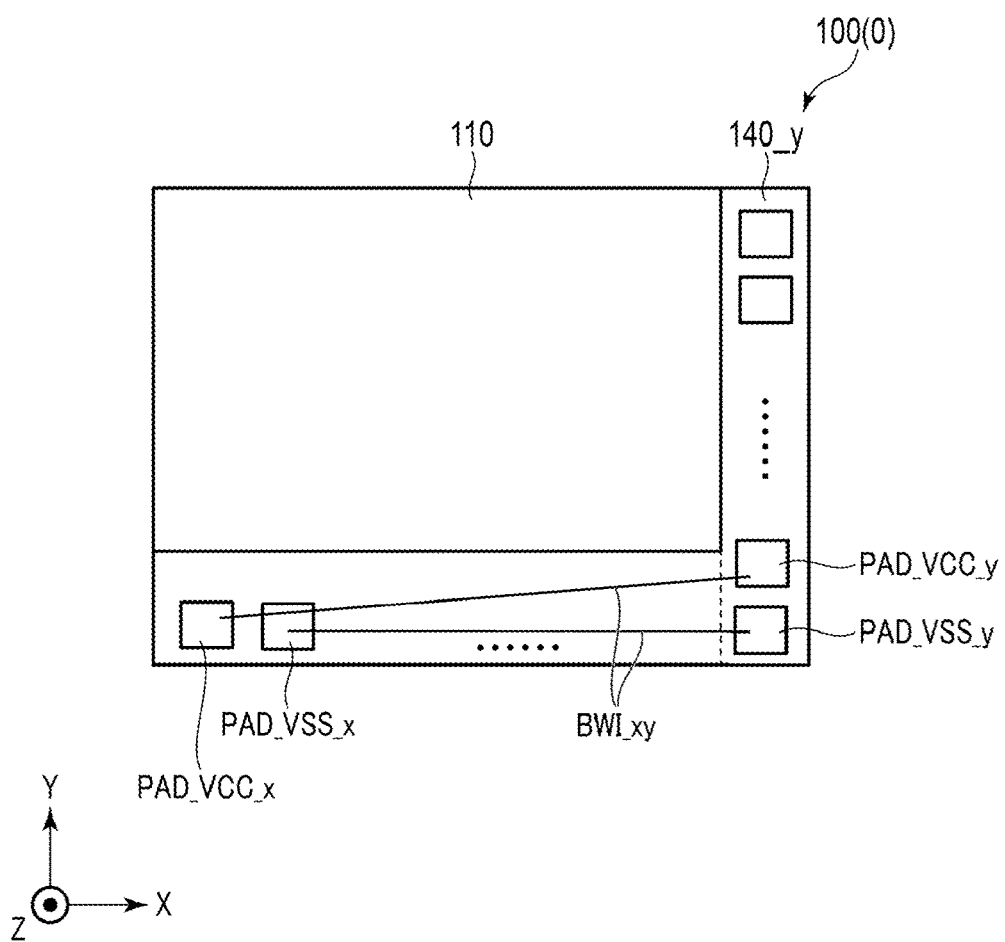
FIG. 21 is a plan view of FIG. 20.

Another example of the layout of the memory chips 100 will be described with reference to FIG. 20 and FIG. 21. FIG. 20 is a perspective view of the memory chip. FIG. 21 is a plan view of FIG. 20.

As shown in FIG. 20 and FIG. 21, the pad PAD_VCC_x and the pad PAD_VCC_y are connected by the bonding wire BWI_xy. In addition, similarly to the first embodiment, the pad PAD_VSS_x and the pad PAD_VSS_y are connected by the bonding wire BWI_xy. As described above, in a case of a set of pads having the same function, the set of pads may be connected by the bonding wires in the same memory chip. In addition, the extending directions of the bonding wires on the XY plane may be different from each other so that the bonding wires do not come into contact with each other.

3-2. Effects

According to the embodiment described above, the pads having the same function may be connected to each other in the same memory chip using a plurality of bonding wires. As a result, the voltage in the same memory chip 100 can be further stabilized.

3-3. Modification Example

Figure 22:
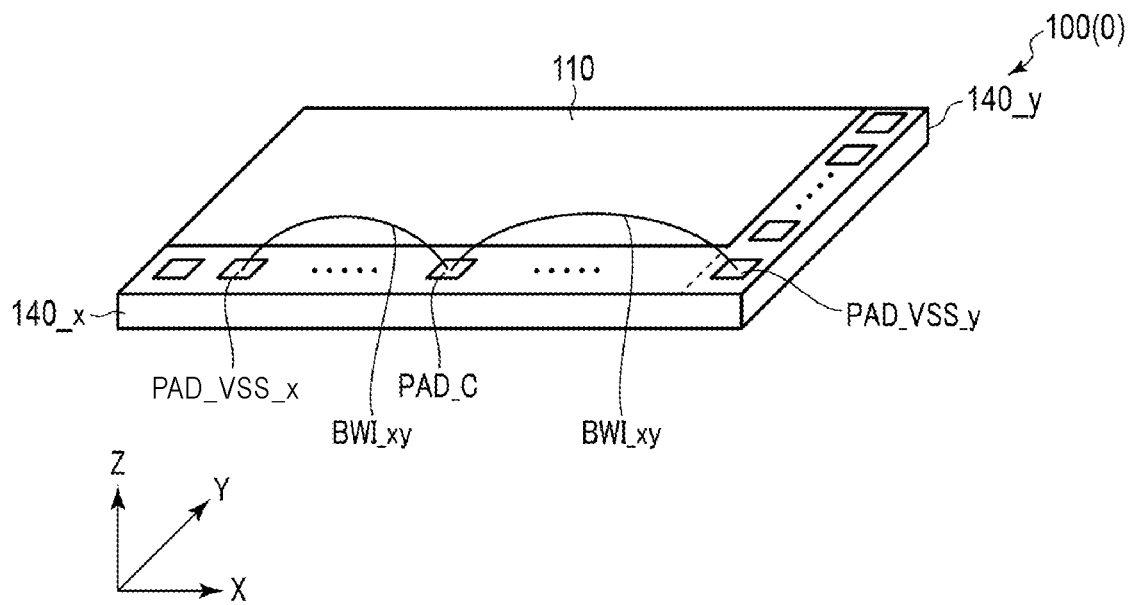
FIG. 22 is a perspective view of the memory chip that depicts a bonding wire arrangement according to a modified example of the third embodiment.
Figure 23:
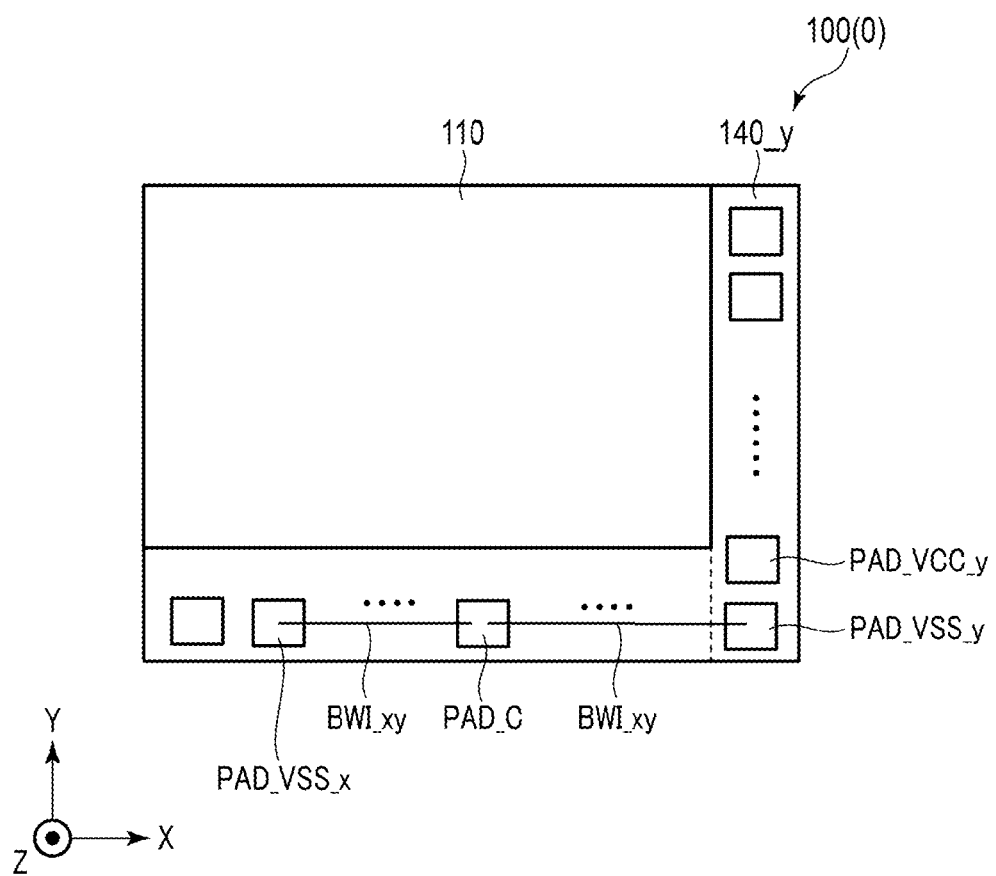
FIG. 23 is a plan view of FIG. 22.

A modification Example of the third embodiment will be described with reference to FIG. 22 and FIG. 23. FIG. 22 is a perspective view of the memory chip. FIG. 23 is a plan view of FIG. 22.

Furthermore, as illustrated in FIG. 22 and FIG. 23, in the same memory chip, a relay pad PAD_C (which is an island-shaped relay point pad) for connecting a pad and another pad may be provided. The relay pad PAD_C is not directly connected to the internal wiring (for example, of the wiring layer M2) of the memory chip 100.

The longer the bonding wire is, the more it bends, and thus, there is a concern that the bonding wire may come into contact with a portion of the memory chip 100 other than the pad. By providing the relay pad PAD_C, the bonding wire can be prevented from bending as much. That is, by providing the relay pad PAD_C, the shape (arc shape) of the bonding wire for connecting the pads can be made appropriate.

Both the pads connected by the bonding wires and the relay pad PAD_C may be connected by the internal wiring of the memory chip 100. In such a case, the bonding wire functions as a parallel wiring path for further reducing the resistance of the wiring path formed by the internal wiring of the memory chip 100.

4. Fourth Embodiment

Subsequently, a fourth embodiment will be described. In the fourth embodiment, a case where a spacer is provided between memory chips will be described. The description of the same components as those in the above-described embodiment will be omitted. In addition, the fourth embodiment can be combined with the first to third embodiments.

4-1. Method of Stacking

Figure 24:
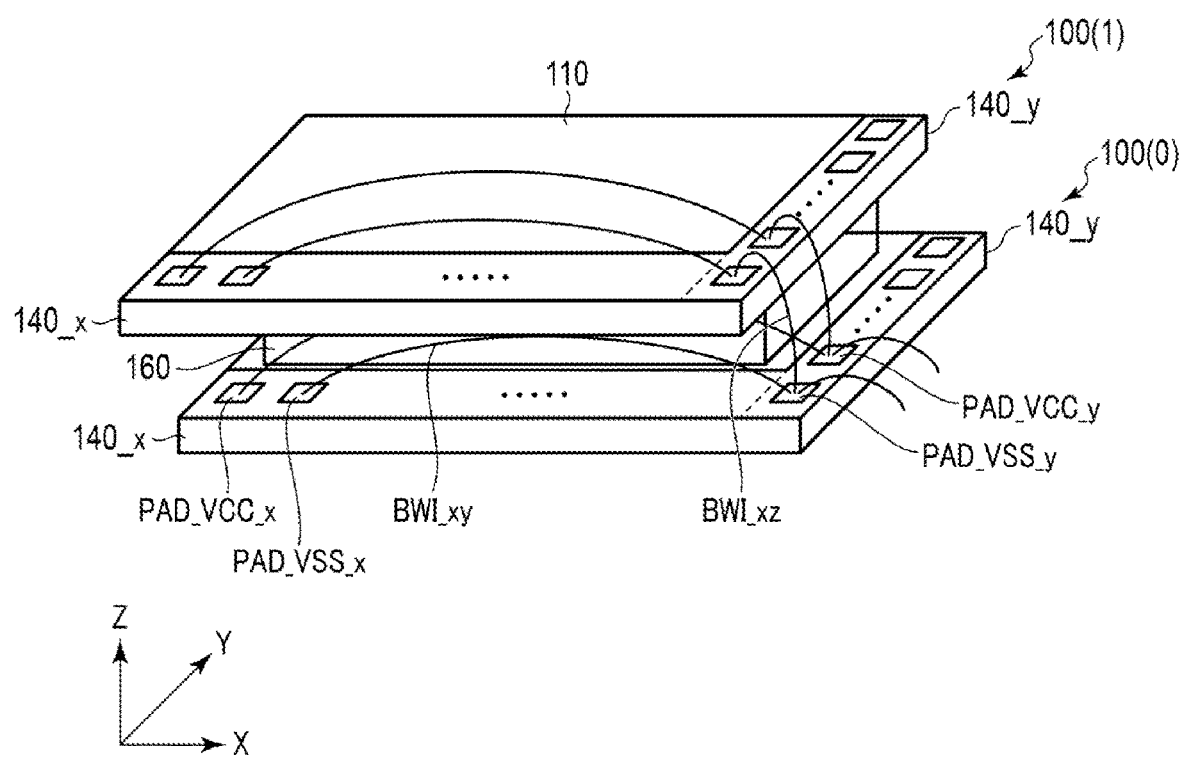
FIG. 24 is a perspective view of a stack structure in which memory chips are stacked according to a fourth embodiment.
Figure 25:
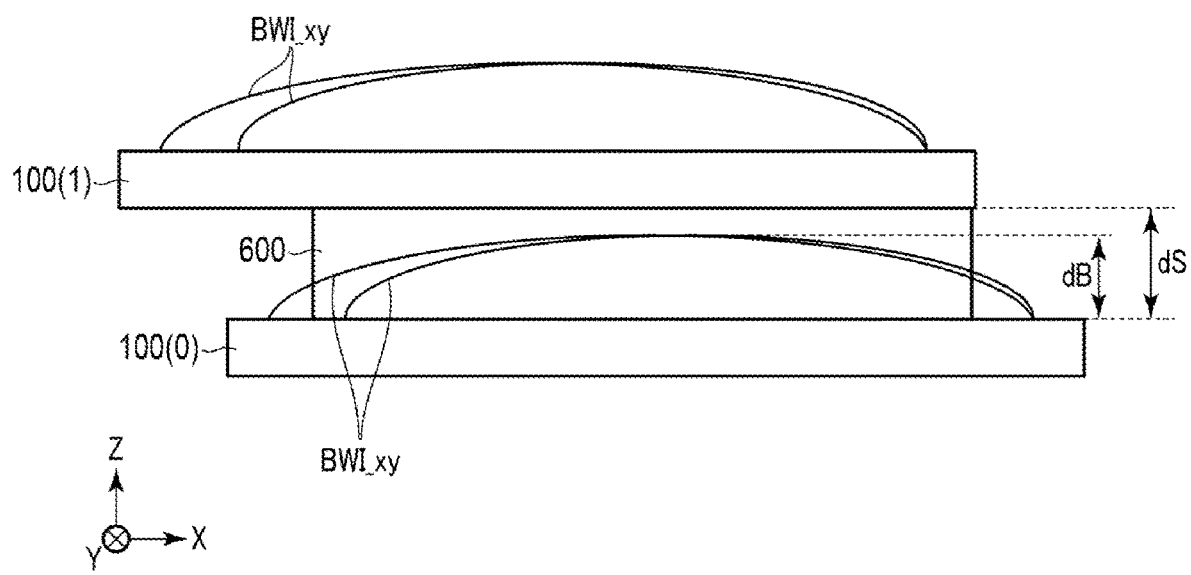
FIG. 25 is a cross-sectional view of FIG. 24 showing a first example of a spacer employed in the stack structure.

A bonding wire when a spacer is provided between the memory chips will be described with reference to FIG. 24 and FIG. 25. FIG. 24 is a perspective view of a stack structure in which the memory chips are stacked. FIG. 25 is a cross-sectional view of FIG. 24.

As illustrated in FIG. 24 and FIG. 25, a spacer 600 is provided between the memory chip 100(0) and the memory chip 100(1). Then, as illustrated in FIG. 24, since the pads provided in the peripheral area 140_y of the memory chip 100(0) and the pads provided in the peripheral area 140_y of the memory chip 100(1) are connected by the bonding wires, the peripheral area 140_y of the memory chip 100(0) provided at the lower layer is exposed in the Z direction.

As illustrated in FIG. 25, it is desirable that a film thickness dS of the spacer 600 in the Z direction be larger than a height dB of the bonding wire in the Z direction. In this way, for example, it is possible to make it difficult for the bonding wire relating to the voltage VCC to come into contact with the memory chip 100 in the upper layer.

4-2. Effects

According to the embodiment described above, the spacer is provided between the memory chips. As a result, even when a plurality of memory chips are stacked, the bonding wires can be appropriately provided between the pads of the same memory chip.

In this way, for example, when stacking a plurality of memory chips, it becomes possible to stack the memory chips while shifting the memory chips along only the X direction or the Y direction.

4-3. Modification Example 1

Figure 26:
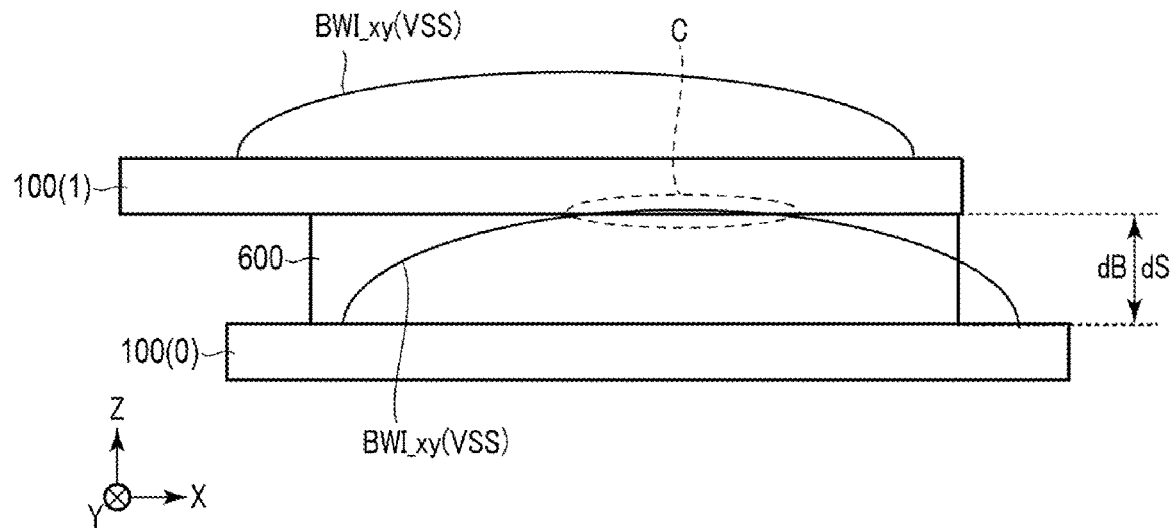
FIG. 26 is a cross-sectional view of FIG. 24 showing a first example of a spacer employed in the stack structure.

Subsequently, a modification example 1 of the fourth embodiment will be described with reference to FIG. 26. FIG. 26 is a cross-sectional view of FIG. 24.

As illustrated in FIG. 26, a bonding wire that transfers the voltage VSS may be arranged so as to be in contact with the memory chip 100 provided in the upper layer in the Z direction or the spacer 600 (refer to C in the drawing). Since the voltage VSS is a low voltage in the circuit, even if it is in contact with the other memory chip 100 or the spacer 600, the influence thereof is small.

According to this, the film thickness dS of the spacer 600 can be reduced, and the height of the stacked body of the memory chips 100 in the Z direction can be reduced.

4-2. Modification Example 2

Figure 27:
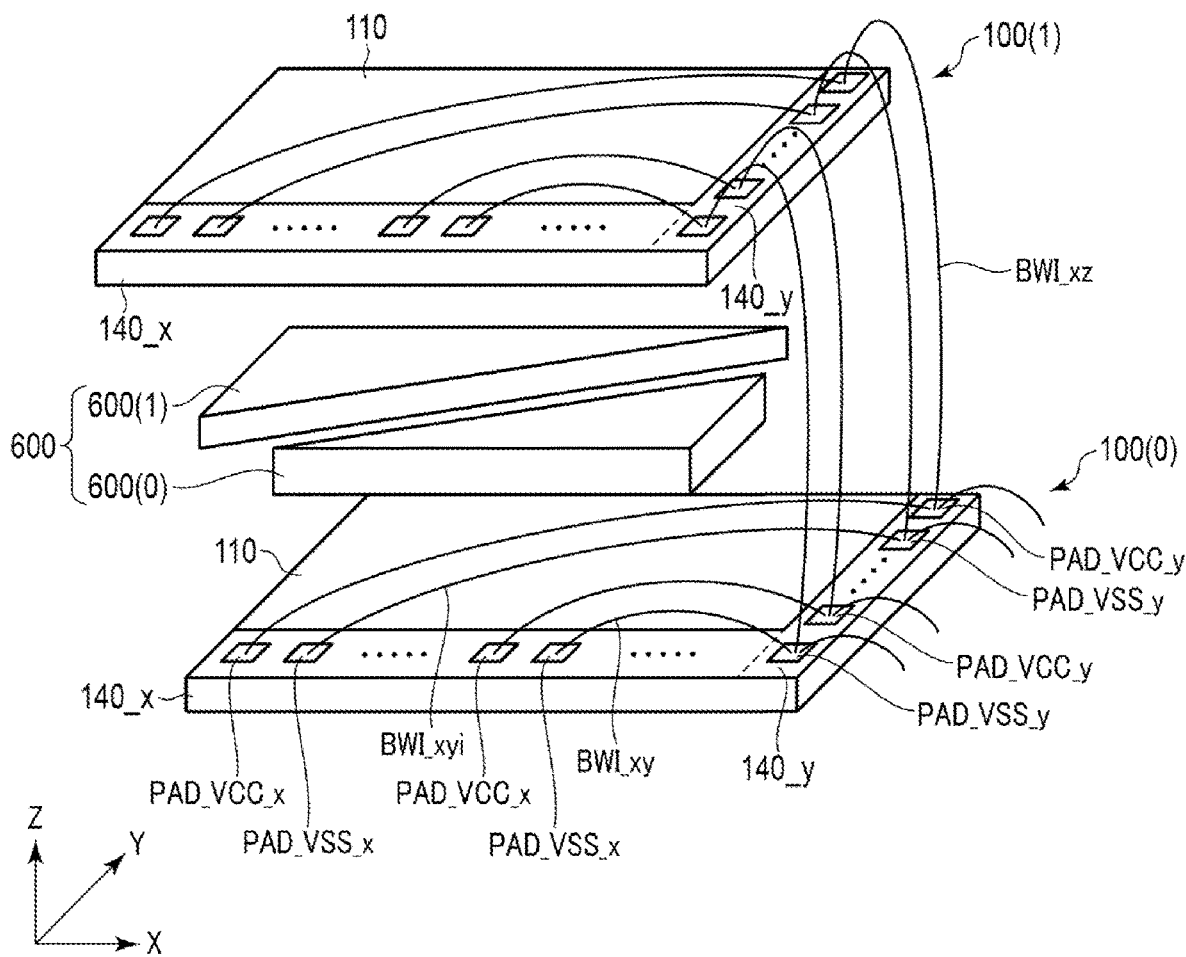
FIG. 27 is a perspective view of a stack structure in which memory chips are stacked, and showing a third example of a spacer employed in the stack structure.
Figure 28:
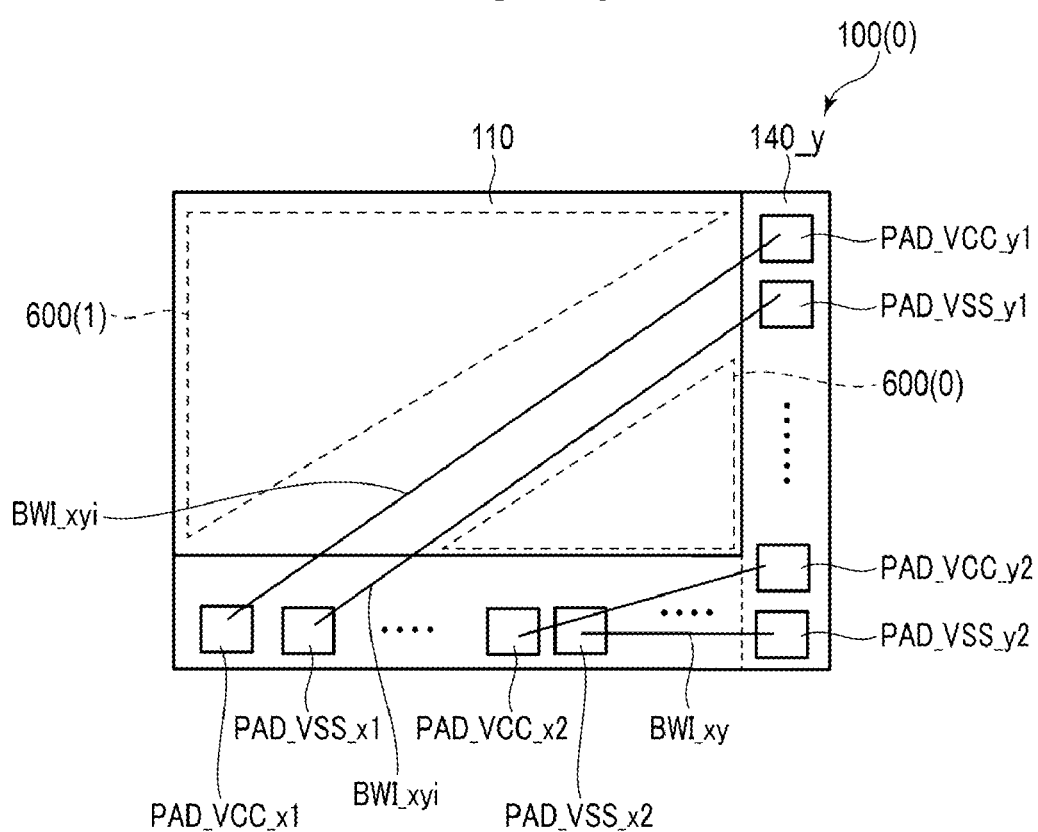
FIG. 28 is a cross-sectional view of FIG. 27.

Subsequently, a modification example 2 of the fourth embodiment will be described with reference to FIG. 27 and FIG. 28. A bonding wire when the spacer is provided between the memory chips will be described with reference to FIG. 27 and FIG. 28. FIG. 27 is a perspective view of a stack structure in which the memory chips are stacked. FIG. 28 is a cross-sectional view of FIG. 27.

As illustrated in FIG. 27 and FIG. 28, in the modification example 2, the bonding wires that connect the pads having the same function in the same memory chip 100 are provided.

Specifically, a bonding wire BWI_xyi passing above the core circuit 110 in the Z direction is provided. For example, the spacer 600 is not provided in the area on the core circuit 110 where the bonding wire BWI_xyi is provided.

As illustrated in FIG. 27 and FIG. 28, the spacer 600 is divided into two spacers (600(0) and 600(1)). The bonding wire BWI_xyi is provided between the divided spacers 600(0) and 600(1) to connect the pad provided in the peripheral area 140_y and the pad provided in the peripheral area 140_x.

In this way, by designing the shape of the spacer 600, the flexibility of wiring of the bonding wire in the same memory chip is increased.

Here, a case where the spacer 600 is divided into two spacers is described, but is not limited thereto. A part of the spacer 600 may be removed so that at least the bonding wire BWI_xyi can be provided in the removed region of the spacer 600.

5. Fifth Embodiment

Subsequently, a fifth embodiment will be described. In the fifth embodiment, a case where the technology in the first embodiment is applied to a pad relating to a chip address will be described. The description of the same components as those in the above-described embodiment will be omitted. In addition, the fifth embodiment can be combined with the first to fourth embodiments.

5-1. Configuration

A stack structure of the memory chips in the package according to the fifth embodiment will be described with reference to FIG. 29. FIG. 29 is a perspective view of a stack structure in which memory chips are stacked.

For example, in the package 11 including a plurality of memory chips 100, it is necessary to assign an address to each memory chip 100.

For example, a plurality of chip address pads PAD_CADD are provided on each memory chip 100. The number of pads PAD_CADD is prepared according to the number of memory chips 100 in the package 11. The signal input to the pad PAD_CADD is, for example, the voltage VCC.

In the present embodiment, the chip address pad PAD_CADD is provided in the first area (for example, the peripheral area 140_x) along the X direction of the memory chip 100, but not limited thereto. The chip address pad PAD_CADD may be provided in the second area (for example, the peripheral area 140_y) along the Y direction of the memory chip 100.

For example, in the example in FIG. 29, four memory chips 100 are stacked. Four values (2 bits) can be assigned to four memory chips 100. Therefore, for example, two pads PAD_CADD(1) and PAD_CADD(2) are prepared for each memory chip 100. By changing the connection by the bonding wire to the pads PAD_CADD(1) and PAD_CADD (2) for each memory chip, it becomes possible to assign an address to the memory chip 100.

As a specific example, in the memory chip 100(0), the voltage VCC is input to the pads PAD_CADD(1) and PAD_CADD(2). In the memory chip 100(1), the voltage VCC is input to the pad PAD_CADD(1). In the memory chip 100(2), the voltage VCC is input to the pad PAD_CADD(2). In the memory chip 100(3), the voltage VCC is not input to the pads PAD_CADD(1) and PAD_CADD(2).

Further specifically, in the memory chip 100(0), the pad PAD_VCC_x and the lead frame are connected to the bonding wire BWT(0).

Similarly, the pad PAD_VCC_x of the memory chip 100(1) and the pad PAD_VCC_x of the memory chip 100(0) are connected to the bonding wire BWI_yz.

In addition, the pad PAD_VCC_x of the memory chip 100(2) and the pad PAD_VCC_x of the memory chip 100(1) are connected to the bonding wire BWI_yz.

Further, the pad PAD_VCC_x of the memory chip 100(3) and the pad PAD_VCC_x of the memory chip 100(2) are connected to the bonding wire BWI_yz.

The pads PAD_CADD(1) and PAD_CADD(2) are connected to the pad PAD_VCC via the bonding wire BWI, to which the voltage VCC is supplied.

As described above, only the pad PAD_VCC_x of the lowermost memory chip 100 0) in the Z direction is connected to the lead frame via the bonding wire BWT(0). Then, the pads PAD_VCC_x of the memory chips 100(0) to 100(3) are respectively connected by the bonding wires BWI_yz. The pads PAD_CADD(1) and PAD_CADD(2) of the memory chips 100(0) to 100(3) are provided with the bonding wires BWI_xy in accordance with the assigned chip address.

5-2. Effects

By applying the first embodiment to the chip address pad PAD_CADD, the number of bonding wires from the pad PAD_CADD to the lead frame can be reduced. As a result, the complexity of the layout of the package 11 caused by the increase in the number of bonding wires can be eliminated. In addition to the chip address pad PAD_CADD, the pad for inputting the signal and/or the pad for supplying the voltage as described in the first embodiment may also be provided in the peripheral area 140_x.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of memory chips each extending in a first direction and a second direction and stacked to partially overlap one another in a third direction, the first, second, and third directions crossing one another, each memory chip including
      a core circuit in which a plurality of memory cells are provided, the core circuit being arranged in a first rectangular region with a first side extending in the first direction and a second side extending in the second direction orthogonal to the first direction,
      a first area adjacent to the first side and extending in the first direction,
      a second area adjacent to the second side and extending in the second direction,
      a third area adjacent to the first area in the first direction and adjacent to the second area in the second direction,
      a first pad provided in the first area,
      a second pad provided in the second area, and
      a third pad provided in the third area;
   a first bonding wire that connects the first and third pads of one of the memory chips;
   a second bonding wire that connects the second pad of a first memory chip of the plurality of memory chips and the second pad of a second memory chip of the plurality of the memory chips,
   wherein the second memory chip is stacked on the first memory chip such that the second memory chip overlaps the core circuit of the first memory chip and does not overlap the first, second, and third pads of the first memory chip in the third direction.

2. The semiconductor memory device according to claim 1, further comprising:
   an encapsulating resin formed to be in contact with the first, second, and third areas of each of the memory chips and the first and second bonding wires.

3. The semiconductor memory device according to claim 1, wherein
   the memory chips include a first group of the memory chips and a second group of the memory chips, and
   the memory chips in the first group are stacked so that each memory chip in the first group stacked above another memory chip in the first group are offset from said another memory chip in the first group in at least one of the first and second directions, and the memory chips in the second group are stacked so that each memory chip in the second group stacked above another memory chip in the second group are offset from said another memory chip in the second group in at least one of the first and second directions.

4. The semiconductor memory device according to claim 1, wherein
   the memory chips include a first group of the memory chips and a second group of the memory chips,
   the memory chips in the first group are stacked so that each memory chip in the first group stacked above another memory chip in the first group are offset from said another memory chip in the first group in both the first direction and the second direction, and
   the memory chips in the second group are stacked so that each memory chip in the second group stacked above another memory chip in the second group are offset from said another memory chip in the second group in both the first direction and the second direction.

5. The semiconductor memory device according to claim 1, further comprising:
   a spacer sandwiched between a first group of the memory chips and a second group of the memory chips in the third direction.

6. The semiconductor memory device according to claim 1,
   wherein the first pad and the third pad of each of the memory chips are power supply pads.

7. The semiconductor memory device according to claim 1, further comprising:
   a plurality of logic control pads and a plurality of input/output pads provided in the second area of each of the memory chips;
   a plurality of logic control wires that connect the logic control pads of the first memory chip and the logic control pads of the second memory chip; and
   a plurality of input/output wires that connect the input/output pads of the first memory chip and the input/output pads of the second memory chip.

8. The semiconductor memory device according to claim 1, wherein
   the plurality of memory chips further includes a third memory chip and a fourth memory chip stacked on the third memory chip.

9. The semiconductor memory device according to claim 8, wherein
   the second memory chip is offset from the first memory chip in the first and second directions and the third memory chip is offset from the fourth memory chip in the first and second directions, and
   an amount of offset of the second memory chip with respect to the first memory chip in the first and second directions and an amount of offset of the fourth memory chip with respect to the third memory chip in the first and second directions are the same.

10. The semiconductor memory device according to claim 9, wherein a direction of the offset of the second memory chip with respect to the first memory chip and a direction of the offset of the fourth memory chip with respect to the third memory chip are the same.

11. The semiconductor memory device according to claim 9, wherein a direction of the offset of the second memory chip with respect to the first memory chip and a direction of the offset of the fourth memory chip with respect to the third memory chip are opposite.

12. The semiconductor memory device according to claim 8, further comprising:
   a first lead frame on a first side of the memory chips in the first direction;
   a second lead frame on a second side of the memory chips in the first direction, the second side being on an opposite side of the memory chips with respect to the first side;
   a third bonding wire that connects the first pad of the first memory chip and the first lead frame; and
   a fourth bonding wire that connects the second pad of the first memory chip and the second lead frame.

13. The semiconductor memory device according to claim 1, wherein each of the memory chips includes a relay pad in the first area that is not directly connected to internal circuits of the memory chips and is connected to the first pad and the third pad via bonding wires, respectively.

14. The semiconductor memory device according to claim 1, wherein each of the memory chips includes first and second chip address pads provided in the first area for determining a chip address thereof.

15. A semiconductor memory device comprising:
a plurality of memory chips each extending in a first direction and a second direction and stacked to partially overlap each other in a third direction, the first, second, and third directions crossing one another, each memory chip including
   a core circuit in which a plurality of memory cells are provided, the core circuit being arranged in a first rectangular region with a first side extending in the first direction and a second side extending in the second direction orthogonal to the first direction,
   a first area adjacent to the first side and extending in the first direction,
   a second area adjacent to the second side and extending in the second direction,
   a third area adjacent to the first area in the first direction and adjacent to the second area in the second direction,
   a first power supply pad provided in the first area,
   a second power supply pad provided in the first area,
   a third power supply pad provided in the third area,
   a first signal pad provided in the second area, and
   a second signal pad provided in the second area;
a first bonding wire that connects the second and third power supply pads of each of the memory chips;
a plurality of second bonding wires, each of which connects the third power supply pads of two memory chips that are adjacent to each other in the third direction.

16. The semiconductor memory device according to claim 15, further comprising:
   a plurality of first lead frames on a first side of the plurality of memory chips in the first direction and a second lead frame on a second side of the plurality of memory chips that is opposite to the first side of the plurality of memory chips in the first direction;
   a plurality of first power supply bonding wires, each of which is directly connected to one of the first lead frames and the first power supply pad of one of the memory chips; and
   a second power supply bonding wire directly connected to the second lead frame and the third power supply pad of one of the memory chips.

17. The semiconductor memory device according to claim 16, further comprising:
   a plurality of third bonding wires, each of which connects the first signal pads of two memory chips that are adjacent to each other in the third direction; and
   a plurality of fourth bonding wires, each of which connects the second signal pads of two memory chips that are adjacent to each other in the third direction.

18. The semiconductor memory device according to claim 17, further comprising:
   a plurality of third lead frames on the second side of the plurality of memory chips;
   a first signal bonding wire directly connected to one of the third lead frames and the first signal pad of one of the memory chips; and
   a second signal bonding wire directly connected to one of the third lead frames and the second signal pad of one of the memory chips.

19. The semiconductor memory device according to claim 15, further comprising:
   a spacer between a first group of the memory chips that are adjacent to each other and a second group of the memory chips that are adjacent to each other, the spacer having a height that is greater than a thickness of any one of the memory chips.

20. The semiconductor memory device according to claim 19, wherein
   the memory chips in the first group are stacked so that each memory chip in the first group stacked above another memory chip in the first group are offset from said another memory chip in the first group in at least one of the first and second directions, and the memory chips in the second group are stacked so that each memory chip in the second group stacked above another memory chip in the second group are offset from said another memory chip in the second group in at least one of the first and second directions.

* * * * *